US008872107B2

(12) United States Patent
Tomioka

(10) Patent No.: US 8,872,107 B2
(45) Date of Patent: Oct. 28, 2014

(54) PHOTOCONDUCTIVE ANTENNA, TERAHERTZ WAVE GENERATING DEVICE, CAMERA, IMAGING DEVICE, AND MEASURING DEVICE

(71) Applicant: Seiko Epson Corporation, Tokyo (JP)

(72) Inventor: Hiroto Tomioka, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/717,857

(22) Filed: Dec. 18, 2012

(65) Prior Publication Data

US 2013/0168550 A1 Jul. 4, 2013

(30) Foreign Application Priority Data

Dec. 28, 2011 (JP) ................................. 2011-290068

(51) Int. Cl.
| | |
|---|---|
| *G02F 1/01* | (2006.01) |
| *H01Q 23/00* | (2006.01) |
| *H01L 31/16* | (2006.01) |
| *H01L 33/00* | (2010.01) |
| *H01L 31/09* | (2006.01) |

(52) U.S. Cl.
CPC ............ *H01L 33/0004* (2013.01); *H01Q 23/00* (2013.01); *H01L 31/16* (2013.01); *H01L 31/09* (2013.01)
USPC ........................................................ 250/330

(58) Field of Classification Search
CPC .................. G01N 21/3581; G02F 2203/13
USPC ........................................................ 250/330
See application file for complete search history.

(56) References Cited

U.S. PATENT DOCUMENTS

| 5,894,125 A * | 4/1999 | Brener et al. ................. 250/330 |
| 7,723,708 B2 * | 5/2010 | Ouchi et al. ............... 250/493.1 |
| 7,907,024 B2 * | 3/2011 | Asada et al. ............... 331/107 T |
| 2004/0065832 A1 * | 4/2004 | Cluff et al. ................. 250/341.1 |
| 2009/0326383 A1 * | 12/2009 | Barnes et al. ................. 600/476 |

FOREIGN PATENT DOCUMENTS

| JP | 2006-313803 A | 11/2006 |
| JP | 2007-300022 A | 11/2007 |

* cited by examiner

*Primary Examiner* — Kiho Kim
(74) *Attorney, Agent, or Firm* — Global IP Counselors, LLP

(57) ABSTRACT

A photoconductive antenna is adapted to generate terahertz waves when irradiated by pulsed light. The photoconductive antenna includes first and second conductive layers, a semiconductor layer, and first and second electrodes. The semiconductor layer is made of a semiconductor material having a carrier density that is lower than a carrier density of the semiconductor material of the first conductive layer or the second conductive layer. The first and second electrodes are electrically connected to the first and second conductive layers, respectively. The semiconductor layer includes an incidence surface through which the pulsed light enters the semiconductor layer, and an emission surface from which the terahertz waves are emitted. The incidence surface is positioned in a side surface of the semiconductor layer having a normal direction extending orthogonal to a lamination direction, and the emission surface is positioned in the side surface at a position different from the incidence surface.

31 Claims, 14 Drawing Sheets

PHOTOCONDUCTIVE ANTENNA, TERAHERTZ WAVE GENERATING DEVICE, CAMERA, IMAGING DEVICE, AND MEASURING DEVICE

CROSS-REFERENCE TO RELATED APPLICATIONS

This application claims priority to Japanese Patent Application No. 2011-290068 filed on Dec. 28, 2011. The entire disclosure of Japanese Patent Application No. 2011-290068 is hereby incorporated herein by reference.

BACKGROUND

1. Technical Field

The present invention relates to a photoconductive antenna, a terahertz wave generating device, a camera, an imaging device, and a measuring device.

2. Related Art

In recent years, attention has been devoted to terahertz waves, which are electromagnetic waves with frequencies of 100 GHz or greater and 30 THz or less. Terahertz waves can be used in various forms of measurement and non-destructive testing such as imaging and spectrometry.

The terahertz wave generating device that generates these terahertz waves has a light source device that generates light pulses (pulsed light) having pulse widths at the approximately sub picosecond level (several hundred femtoseconds) and a photoconductive antenna that generates terahertz waves by irradiating light pulses generated by the light pulse generator.

As the photoconductive antenna, for example, disclosed in Japanese Laid-Open Patent Application Publication No. 2007-300022 is a terahertz wave generating device (photoconductive antenna) having a laminated body (pin structure) for which an n type semiconductor layer, an i type semiconductor layer, and a p type semiconductor layer are laminated in that order. With this photoconductive antenna, when light pulses are irradiated on the p type semiconductor layer via an aperture formed on an electrode provided on the p type semiconductor layer, terahertz waves are emitted radially from the entire side surface of the i type semiconductor layer.

With the photoconductive antenna noted in the above mentioned publication, for a dipole shaped photoconductive antenna (PCA) using a low temperature growth GaAs (LT-GaAs) substrate, it is possible to make the intensity of the generated terahertz waves approximately 10 times larger.

However, with the photoconductive antenna noted in the above mentioned publication, light pulses are irradiated on the p type semiconductor layer, and the light pulses that pass through that p type semiconductor layer are made incident on the i type semiconductor layer, so a portion of the light pulses are absorbed by the p type semiconductor layer, and because of that, there is the problem that the terahertz wave generating efficiency decreases.

SUMMARY

An object of the present invention is to provide a photoconductive antenna, a terahertz wave generating device, a camera, an imaging device, and a measuring device capable of generating terahertz waves with better efficiency than the prior art.

This kind of object is achieved by the present invention noted hereafter.

A photoconductive antenna according to one aspect of the present invention is adapted to generate terahertz waves when irradiated by pulsed light. The photoconductive antenna includes a first conductive layer, a second conductive layer, a semiconductor layer, a first electrode and a second electrode. The first conductive layer is made of a semiconductor material containing a first conductive type impurity. The second conductive layer is made of a semiconductor material containing a second conductive type impurity different from the first conductive type impurity. The semiconductor layer is positioned between the first conductive layer and the second conductive layer, and made of a semiconductor material having a carrier density that is lower than a carrier density of the semiconductor material of the first conductive layer or a carrier density of the semiconductor material of the second conductive layer. The first electrode is electrically connected to the first conductive layer. The second electrode is electrically connected to the second conductive layer. The semiconductor layer includes an incidence surface through which the pulsed light enters the semiconductor layer, and an emission surface from which the terahertz waves are emitted. The incidence surface is positioned in a side surface of the semiconductor layer having a normal direction extending orthogonal to a lamination direction of the first conductive layer, the semiconductor layer, and the second conductive layer, and the emission surface is positioned in the side surface of the semiconductor layer at a position different from the incidence surface.

With this configuration, the light pulses (pulsed light) are made incident to the semiconductor directly without going via the semiconductor layer containing a first impurity or the semiconductor layer containing a second impurity, so it is possible to prevent absorption of the light pulses by the semiconductor layer containing a first impurity or the semiconductor layer containing a second impurity, making it possible to generate terahertz waves efficiently.

Also, it is possible to manufacture the terahertz wave generating device by forming the photoconductive antenna and the light source for generating light pulses on a substrate as an integrated unit with that substrate, and with this configuration, it is possible to make the terahertz wave generating device more compact. Also, it is possible to perform alignment of the light source and the photoconductive antenna when forming that light source and photoconductive antenna on the substrate, and with this configuration, it is possible to manufacture the terahertz wave generating device easily.

With the photoconductive antenna according to the above described aspect of the present invention, the semiconductor layer preferably has an elongated shape in which a direction from the incidence surface toward the emission surface is a lengthwise direction as viewed along the lamination direction.

With this configuration, using the semiconductor layer, it is possible to lead the terahertz waves along the lengthwise direction of that semiconductor layer. Therefore, it is possible to generate terahertz waves with directionality.

With the photoconductive antenna according to the above described aspect of the present invention, a width of a part of the semiconductor layer as viewed along the lamination direction preferably increases in a direction from the incidence surface toward the emission surface, the width being defined in a direction orthogonal to the direction from the incidence surface toward the emission surface.

With this configuration, it is possible for terahertz waves to be led efficiently by the semiconductor layer.

With the photoconductive antenna according to the above described aspect of the present invention, the second conductive layer is preferably provided only on a portion of the semiconductor layer, and a side surface of the second conductive layer having a normal direction extending orthogonal to the lamination direction is flush with the incidence surface of the semiconductor layer.

With this configuration, terahertz waves are generated only on a portion of the incidence surface side of the semiconductor layer, so it is possible to suppress interference between terahertz waves within the semiconductor layer.

The photoconductive antenna according to the above described aspect of the present invention preferably further includes a covering layer covering the side surface of the semiconductor layer.

With this configuration, it is possible to prevent corrosion of the semiconductor layer.

With the photoconductive antenna according to the above described aspect of the present invention, a relative dielectric constant of a material of the covering layer provided on the emission surface is preferably higher than a relative dielectric constant of the semiconductor material of the semiconductor layer.

The terahertz waves have the physical property of trying to advance in a material with a higher dielectric constant. Therefore, it is possible to reliably emit terahertz waves generated by the semiconductor layer from the emission surface of that semiconductor layer.

With the photoconductive antenna according to the above described aspect of the present invention, the semiconductor material of the semiconductor layer is preferably a III-V compound.

With this configuration, it is possible to generate high intensity terahertz waves.

A terahertz wave generating device according to another aspect of the present invention includes a photoconductive antenna according to above described aspects of the present invention, and a light source configured and arranged to generate the pulsed light.

With this configuration, it is possible to provide a terahertz wave generating device having the effects of the present invention.

The terahertz wave generating device according to the above described aspect of the present invention preferably further includes a substrate, and the light source and the photoconductive antenna are preferably formed on the substrate as an integrated unit with the substrate With this configuration, it is possible to make the terahertz wave generating device smaller. Also, it is possible to perform alignment of the light source and the photoconductive antenna when forming that light source and the photoconductive antenna on the substrate, and with this configuration, it is possible to easily manufacture the terahertz wave generating device.

A camera according to another aspect of the present invention includes a photoconductive antenna according to the above described aspects of the present invention, a light source configured and arranged to generate the pulsed light, and a terahertz wave detecting unit configured and arranged to detect the terahertz waves emitted from the photoconductive antenna and reflected by an object.

With this configuration, it is possible to provide a camera having the effects of the invention.

An imaging device according to another aspect of the present invention includes a photoconductive antenna according to the above described aspects of the present invention, a light source configured and arranged to generate the pulsed light, a terahertz wave detecting unit configured and arranged to detect the terahertz waves emitted from the photoconductive antenna and transmitted through an object or reflected by the object, and an image forming unit configured and arranged to generate an image of the object based on detection results of the terahertz wave detecting unit.

With this configuration, it is possible to provide an imaging device having the effects of the present invention.

A measuring device according to another aspect of the present invention includes a photoconductive antenna according to the above described aspects of the present invention, a light source configured and arranged to generate the pulsed light, a terahertz wave detecting unit configured and arranged to detect the terahertz waves emitted from the photoconductive antenna and transmitted through an object or reflected by the object, and a measuring unit configured and arranged to measure the object based on detection results of the terahertz wave detecting unit.

With this configuration, it is possible to provide a measuring device having the effects of the present invention.

BRIEF DESCRIPTION OF THE DRAWINGS

Referring now to the attached drawings which form a part of this original disclosure.

DETAILED DESCRIPTION OF EXEMPLARY EMBODIMENTS

Following, a detailed description of the photoconductive antenna, the terahertz wave generating device, the camera, the imaging device, and the measuring device of the present invention will be provided based on preferred embodiments shown in the attached drawings.

First Embodiment

Figure 1:
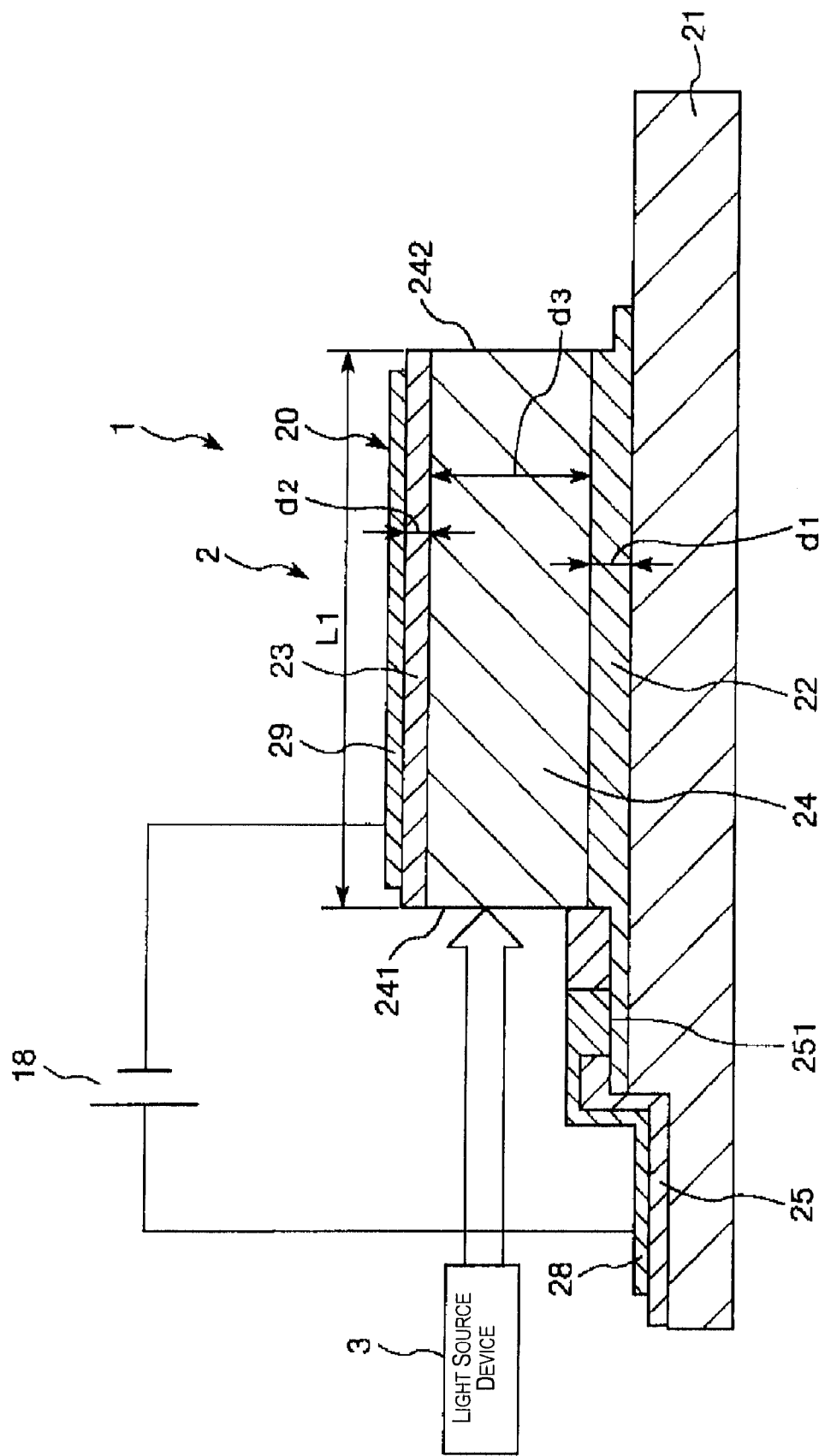
FIG. 1 is a drawing showing a first embodiment of the terahertz wave generating device of the present invention as taken along a line S-S in FIG. 2.
Figure 2:
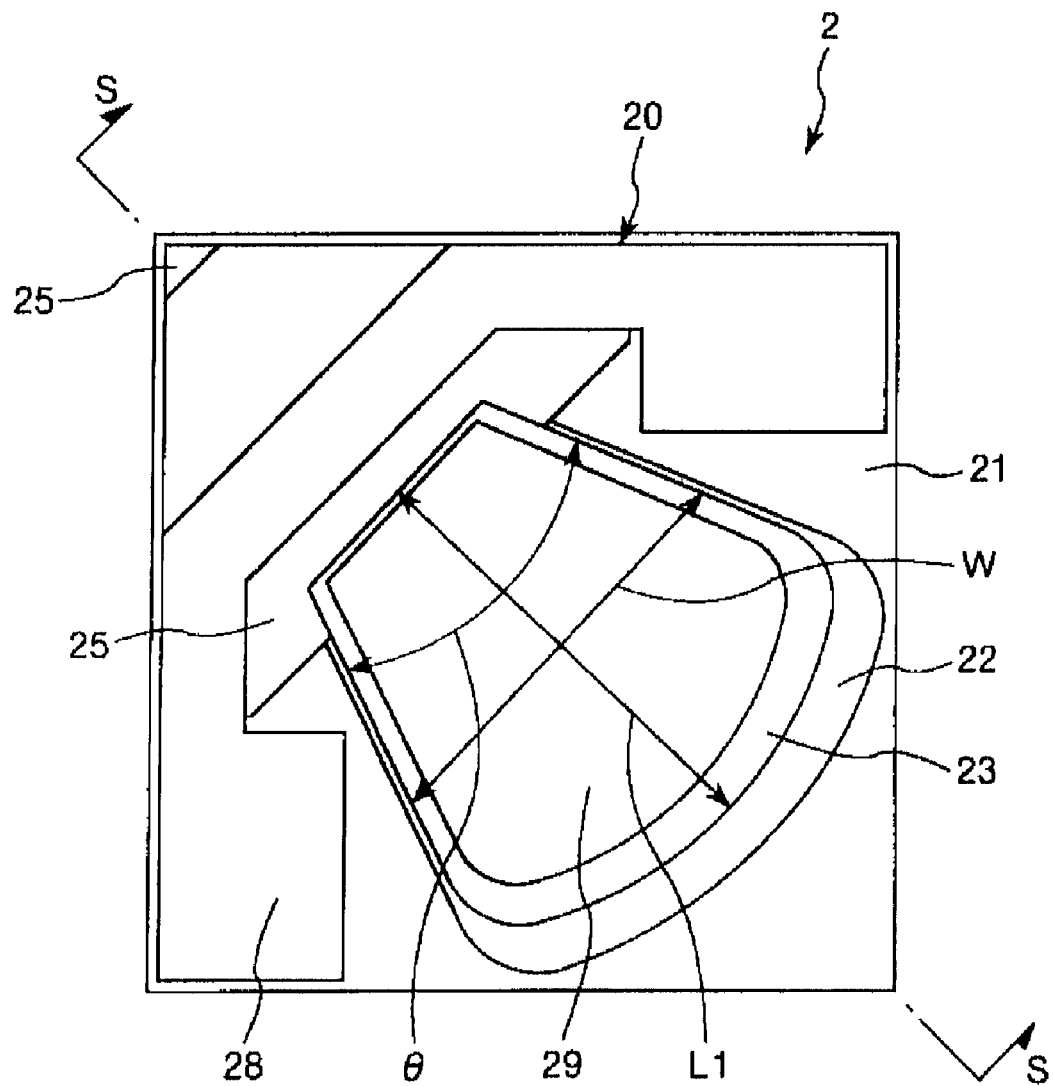
FIG. 2 is a plan view of the photoconductive antenna of the terahertz wave generating device shown in FIG. 1.
Figure 3:
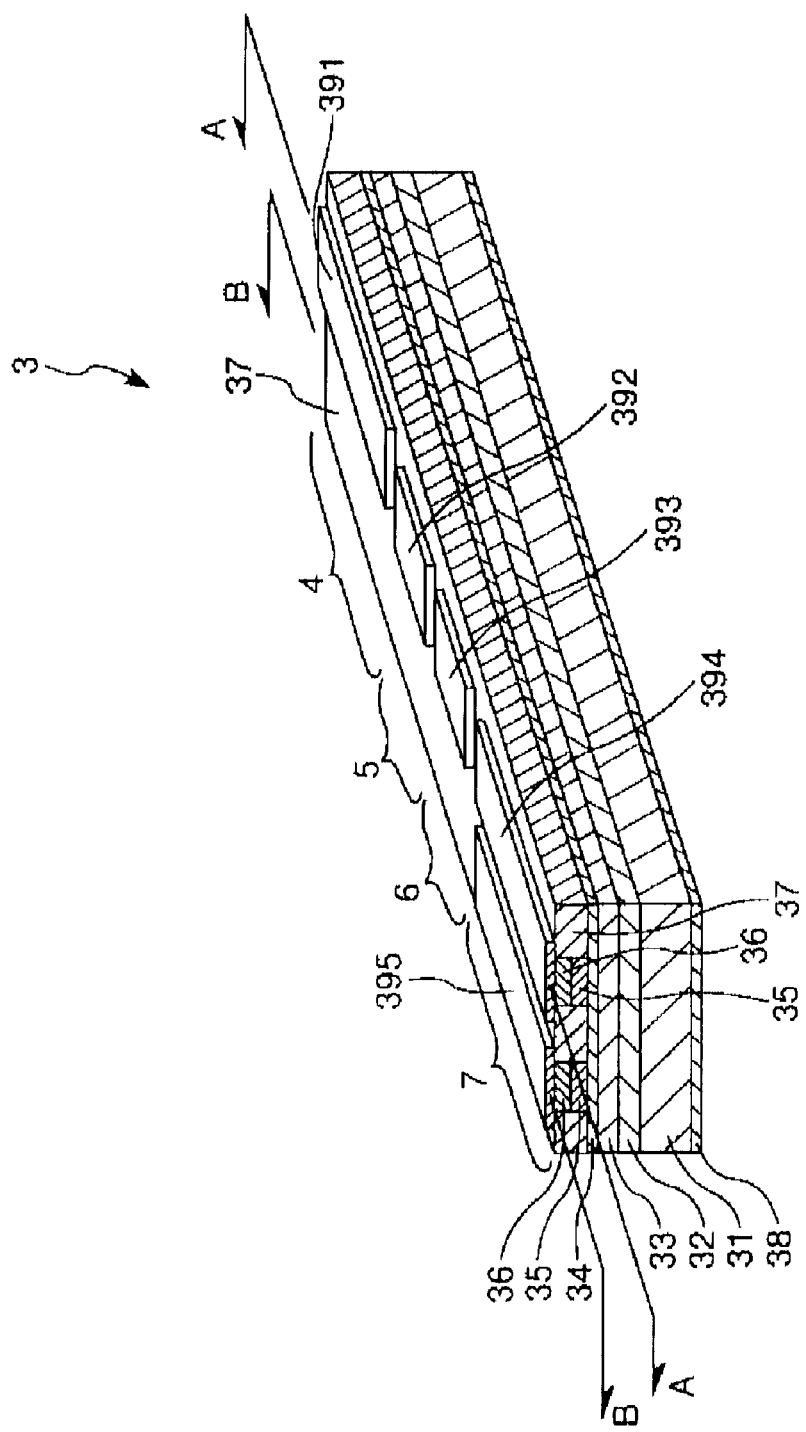
FIG. 3 is a cross section perspective view of the light source device of the terahertz wave generating device shown in FIG. 1.
Figure 4:
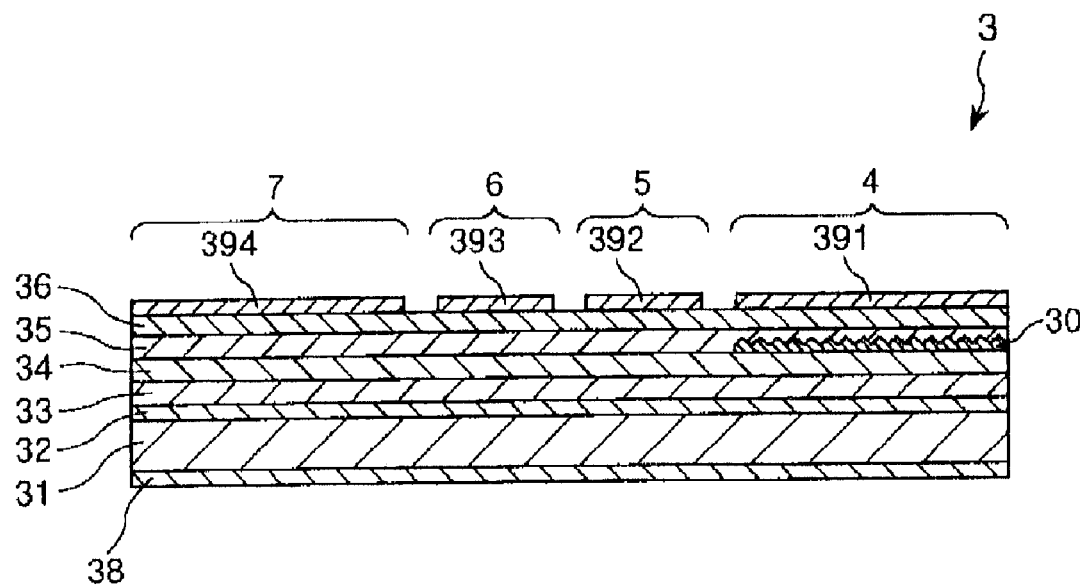
FIG. 4 is a cross section view as taken along a line A-A in FIG. 3.
Figure 5:
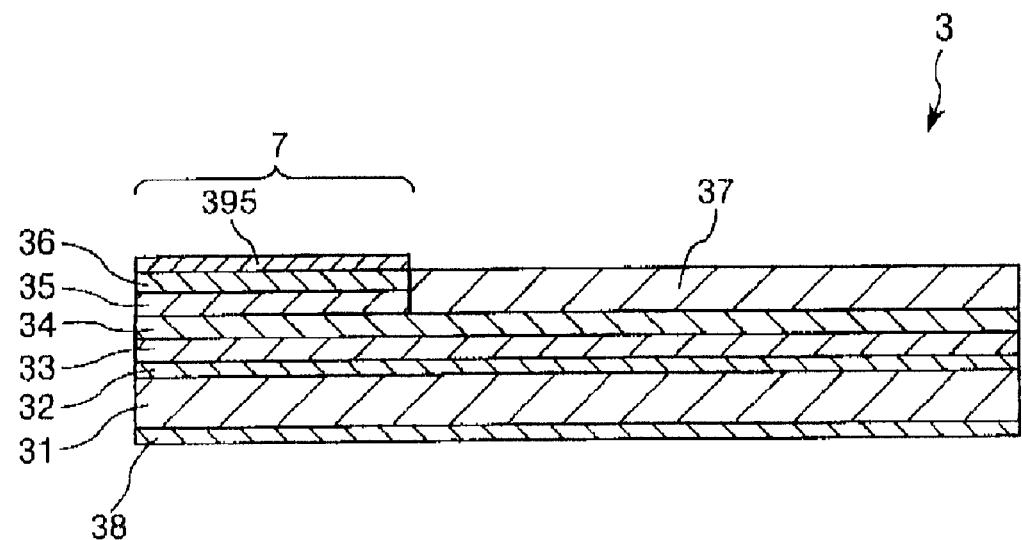
FIG. 5 is a cross section view as taken along a line B-B in FIG. 3.

FIG. 1 is a drawing showing an embodiment of the terahertz wave generating device of the present invention. With this FIG. 1, a cross section view of line S-S in FIG. 2 is shown for the photoconductive antenna, and a block diagram is shown for the light source device. FIG. 2 is a plan view of the photoconductive antenna of the terahertz wave generating device shown in FIG. 1. FIG. 3 is a cross section perspective view of the light source device of the terahertz wave generating device shown in FIG. 1. FIG. 4 is a cross section view of line A-A in FIG. 3. FIG. 5 is a cross section view of line B-B in FIG. 3. FIG. 6 is a plan view showing another constitutional example of the i type semiconductor layer of the photoconductive antenna of the terahertz wave generating device shown in FIG. 1. Note that hereafter, in FIG. 1 and FIG. 3 to FIG. 5, the upper side will be described as "upper" and the lower side will be described as "lower."

As shown in FIG. 1, the terahertz wave generating device 1 has a light source device 3 that generates light pulses (pulsed light) which is excitation light, and a photoconductive antenna 2 for generating terahertz waves by irradiating light pulses generated by the light source device 3. A terahertz wave means an electromagnetic wave for which the frequency is 100 GHz or greater and 30 THz or less, and particularly an electromagnetic wave of 300 GHz or greater and 3 THz or less.

As shown in FIG. 3 to FIG. 5, with this embodiment, the light source device 3 has a light pulse generator 4 that generates light pulses, a first pulse compressor 5 that performs pulse compression on light pulses generated by the light pulse generator 4, a second pulse compressor 7 that performs pulse compression on light pulses for which pulse compression was done by the first pulse compressor 5, and an amplifier 6 that amplifies the light pulses.

The amplifier 6 can be provided at the front stage of the first pulse compressor 5, or between the first pulse compressor 5 and the second pulse compressor 7, but with the configuration in the drawing, the amplifier 6 is provided between the first pulse compressor 5 and the second pulse compressor 7. With this configuration, the light pulses which underwent pulse compression by the first pulse compressor 5 are amplified by the amplifier 6, and the light pulses amplified by the amplifier 6 undergo pulse compression by the second pulse compressor 7.

Also, the pulse width (half-value width) of the light pulses emitted from the light source device 3 is not particularly restricted, but is preferably 1 femtosecond or greater and 800 femtoseconds or less, and more preferably 10 femtoseconds or greater and 200 femtoseconds or less.

Also, the frequency of the light pulses emitted from the light source device 3 is set to the same or greater frequency corresponding to the band gap of the i type semiconductor layer 24 of the photoconductive antenna 2 described later.

Also, the light pulse generator 4 can use a so-called semiconductor laser such as a DBR laser, DFB laser, mode locked laser or the like, for example. The pulse width of the light pulses generated by this light pulse generator 4 is not particularly restricted, but is preferably 1 picosecond or greater and 100 picoseconds or less.

Also, the first pulse compressor 5 performs pulse compression based on saturable absorption. Specifically, the first pulse compressor 5 has a saturable absorber, and using that saturable absorber, light pulses are compressed and pulse width is decreased.

Also, the second pulse compressor 7 performs pulse compression based on group velocity dispersion compensation. Specifically, the second pulse compressor 7 has a group velocity dispersion compensation medium, and with this embodiment a coupled waveguide structure, and using that coupled waveguide structure, light pulses are compressed and pulse width is decreased.

Also, the light pulse generator 4 of the light source device 3, the first pulse compressor 5, the amplifier 6, and the second pulse compressor 7 are made into an integral unit, specifically, integrated on the same substrate.

In specific terms, the light source device 3 has a substrate 31 which is a semiconductor substrate, a cladding layer 32 which is provided on the substrate 31, an active layer 33 which is provided on the cladding layer 32, a waveguide structure processing etching stop layer 34 provided on the active layer 33, a cladding layer 35 provided on the waveguide structure processing etching stop layer 34, a contact layer 36 provided on the cladding layer 35, an insulation layer 37 provided on the waveguide structure processing etching stop layer 34, a cladding layer 32 side electrode 38 provided on the surface of the substrate 31, and cladding layer 35 side electrodes 391, 392, 393, 394, and 395 provided on the contact layer 36 and the insulation layer 37 surface. Also, a diffraction grating 30 is provided between the waveguide structure processing etching stop layer 34 of the light pulse generator 4 and the cladding layer 35. Note that the waveguide structure processing etching stop layer is not limited to being provided directly above the active layer, but can also be provided within the cladding layer, for example.

The materials of each part are not particularly restricted, but an example for the substrate 31 and the contact layer 36 is GaAs or the like. Also, an example for the cladding layers 32 and 35, the waveguide structure processing etching stop layer 34, and the diffraction grating 30 includes AlGaAs or the like. Also, for the active layer 33, an example is a structure using a quantum effect called a multiple quantum well or the like. In specific terms, an example of the active layer 33 is an item with a structure called a distributed index of refraction multiple quantum well structured with multiple quantum wells or the like made by alternately providing a plurality of well layers (GaAs well layers) and barrier layers (AlGaAs barrier layers) or the like.

With the constitution in the drawing, the waveguide of the light source device 3 is constituted from the cladding layer 32, the active layer 33, the waveguide structure processing etching stop layer 34, and the cladding layer 35. Also, the cladding layer 35 is provided in a shape corresponding to the waveguide, only on the top part of the waveguide. Also, the cladding layer 35 is formed by removal of the unnecessary parts by etching. Depending on the manufacturing method, it is possible to omit the waveguide structure processing etching stop layer 34.

Also, two each of the cladding layer 35 and the contact layer 36 are provided. One of the cladding layer 35 and the contact layer 36 constitute the light pulse generator 4, the first pulse compressor 5, the amplifier 6, and part of the second pulse compressor 7, and are provided sequentially, and the other cladding layer 35 and contact layer 36 constitute part of the second pulse compressor 7. Specifically, one pair of cladding layers 35 and one pair of contact layers 36 are provided on the second pulse compressor 7.

Also, the electrode 391 is provided so as to correspond to the cladding layer 35 of the light pulse generator 4, the electrode 392 is provided so as to correspond to the cladding layer 35 of the first pulse compressor 5, the electrode 393 is provided so as to correspond to the cladding layer 35 of the amplifier 6, and the electrodes 394 and 395 are provided so as to respectively correspond to the two cladding layers 35 of the second pulse compressor 7. The electrode 38 is a shared electrode of the light pulse generator 4, the first pulse compressor 5, the amplifier 6, and the second pulse compressor 7. Then, the pair of electrodes of the light pulse generator 4 is constituted by the electrode 38 and the electrode 391, the pair of electrodes of the first pulse compressor 5 is constituted by the electrode 38 and the electrode 392, the pair of electrodes of the amplifier 6 is constituted by the electrode 38 and the electrode 393, and the two pairs of electrodes of the second pulse compressor 7 are constituted by the electrode 38 and electrode 394 and the electrode 38 and electrode 395.

The overall shape of the light source device 3 is a rectangular solid with the constitution in the drawing, but naturally it is not restricted to this.

Also, the dimensions of the light source device 3 are not particularly restricted, but for example can be 1 mm or greater and 10 mm or less×0.5 mm or greater and 5 mm or less×0.1 mm or greater and 1 mm or less.

With the present invention, it also goes without saying that the constitution of the light source device is not restricted to the previously described constitution.

Next, the photoconductive antenna 2 will be described.

As shown in FIG. 1 and FIG. 2, the photoconductive antenna 2 has a substrate 21 and a photoconductive antenna main unit 20 provided on the substrate 21.

The substrate 21 is not restricted provided it is an item that can support the photoconductive antenna main unit 20, and though it is possible to use a semiconductor substrate constituted by various types of semiconductor material, a resin substrate constituted by various types of resin material, or a glass substrate constituted by various types of glass material, a semiconductor substrate is preferable. Also, when using a semiconductor substrate as the substrate 21, as its semiconductor material, though not particularly restricted, it is possible to use various types of items, but a III-V compound semiconductor is preferable. Also, as the III-V compound semiconductor, though not particularly restricted, examples include GaAs, InP, InAs, InSb and the like.

Also, with the configuration in the drawing, the shape of the substrate 21 is rectangular when seen from the lamination direction (as viewed along the lamination direction) of the n type semiconductor layer 22, the i type semiconductor layer 24, and the p type semiconductor layer 23 described later. The shape of the substrate 21 is not restricted to being rectangular, and can also be a circle, an oval, or another polygon or the like such as a triangle, a pentagon, a hexagon or the like. Hereafter, "when seen from the lamination direction of the n type semiconductor layer 22, the i type semiconductor layer 24, and the p type semiconductor layer 23" is also called "the planar view." Also, "the lamination direction of the n type semiconductor layer 22, the i type semiconductor layer 24, and the p type semiconductor layer 23" is also simply stated as "the lamination direction."

The photoconductive antenna main unit 20 has an n type semiconductor layer (first conductive layer) 22, an i type semiconductor layer (semiconductor layer) 24 that generates terahertz waves and has the function of leading those terahertz waves, a p type semiconductor layer (second conductive layer) 23, an insulation layer 25, and an electrode (first electrode) 28 and an electrode (second electrode) 29 constituting the pair of electrodes.

In this case, on the substrate 21, the n type semiconductor layer 22, the i type semiconductor layer 24, and the p type semiconductor layer 23 are laminated (provided) in that order from the substrate 21 side. Specifically, on the substrate 21 is formed a laminated body (pin structure) for which the n type semiconductor layer 22, the i type semiconductor layer 24, and the p type semiconductor layer 23 are laminated in that order from the substrate 21 side. In other words, the i type semiconductor layer 24 is formed sandwiched by the n type semiconductor layer 22 and the p type semiconductor layer 23.

Then, of the surfaces exposed between the i type semiconductor layer 24 n type semiconductor layer 22 and the p type semiconductor layer 23 (specifically, the part of the i type semiconductor layer 24 at the side surface of the laminated body), the side surface of the left side in FIG. 1 constitutes the incidence surface 241 at which the light pulses are made incident, and the end surface of the right side in FIG. 1 constitutes the emission surface 242 at which the terahertz waves generated by the i type semiconductor layer 24 are emitted. Specifically, it can be said that at least a portion of the surface (side surface) of the i type semiconductor layer 24 having a normal line perpendicular to the lamination direction transmits the light pulses, and at least a portion of the surface of the i type semiconductor layer 24 having a normal line perpendicular to the lamination direction transmits the terahertz light generated by the i type semiconductor layer 24. With this configuration, the light pulses are made incident on the i type semiconductor layer 24 directly, without passing through the n type semiconductor layer 22 or the p type semiconductor layer 23, so it is possible to prevent the absorption of the light pulses by the n type semiconductor layer 22 or the p type semiconductor layer 23, making it possible to generate terahertz waves with good efficiency.

Also, the insulation layer 25 is provided on the substrate 21, and at a site at which the type semiconductor layer 24 is not provided on the n type semiconductor layer 22. Also, an aperture 251 is formed on a portion of the insulation layer 25 on the n type semiconductor layer 25.

Also, the electrode 28 is provided on the insulation layer 25, and is in contact with the n type semiconductor layer 22 via the aperture 251, and is electrically connected to that n type semiconductor layer 22.

Also, the electrode 29 is provided on the p type semiconductor layer 23. Specifically, the electrode 29 is in contact with the p type semiconductor layer 23, and is electrically connected to that p type semiconductor layer 23. This electrode 29 is provided on roughly the entire p type semiconductor layer 23, and also works as a reflective layer for reflecting the terahertz waves generated by the i type semiconductor layer 24. With this configuration, it is possible to reflect the terahertz waves that leak to the outside from the top surface of the p type semiconductor layer 23 to the i type semiconductor layer 24 side (to the side of the laminated body interior), making it possible to lead terahertz waves efficiently.

Here, the shape of the i type semiconductor layer 24 is not particularly restricted, but it is preferably an elongated shape. Here, an elongated shape indicates a shape for which with a planar view, compared to the length of one direction, the length of the other direction orthogonal to that one direction is longer. Then, if this condition is fulfilled, the shape is not restricted to being a rectangle. With this configuration, with the i type semiconductor layer 24, it is possible to lead the terahertz waves along the lengthwise direction of the i type semiconductor layer 24, and with this configuration, it is possible to generate high intensity terahertz waves which have directionality.

With the configuration in the drawing, the i type semiconductor layer 24 has an elongated shape, in specific terms, with the planar view, has a shape for which the center side part of a fan shape (the part including the intersection of the two straight lines constituting the outer form of the fan shape) is removed. Specifically, the incidence surface 241 of the i type semiconductor layer 24 is a flat plane, and the emission surface 242 is a curved convex surface (curved surface). With the planar view, the shape of the incidence surface 241 of the i type semiconductor layer 24 is a straight line shape, and the shape of the emission surface 242 is an arc shape (curved line shape). Also, with a planar view, the width W of the i type semiconductor layer 24 gradually increases from the incidence surface 241 side toward the emission surface 242 side. The length L1 of the lengthwise direction orthogonal to the width W of the i type semiconductor layer 24 is larger than the maximum width W of the i type semiconductor layer 24. With this configuration, it is possible to have the terahertz waves led efficiently by the i type semiconductor layer 24.

The i type semiconductor layer 24 may also have the width W for only a portion thereof gradually increase from the incidence surface 241 side toward the emission surface 242 side. Specifically, with a planar view, the i type semiconductor layer 24 may also have a site for which the width W gradually increases from the incidence surface 241 side toward the emission surface 242 side.

Also, the dimensions of the i type semiconductor layer 24 are not particularly restricted, and are set as appropriate according to various conditions, but the length L1 of the lengthwise direction of the i type semiconductor layer 24 is preferably 30 μm or greater and 3 mm or less, and more preferably 30 μM or greater and 0.3 mm or less. Also, the angle (center angle) θ in the drawing of the i type semiconductor layer 24 is preferably 5° or greater and 170° or less, and more preferably 10° or greater and 90° or less.

Also, the shapes of the n type semiconductor layer 22 and the p type semiconductor 23 are not particularly restricted, but with the configuration in the drawing, with a planar view, the n type semiconductor layer 22 is formed so as to contain the i type semiconductor layer 24 and the p type semiconductor layer 23. Also, the i type semiconductor layer 24 and the p type semiconductor layer 23 have the same shape with the planar view. In this way, with the planar view, the n type semiconductor layer 22 and the p type semiconductor 23 are formed so as to have the same shape as the i type semiconductor layer 24 or to contain the i type semiconductor layer 24, and with this configuration, with the planar view, terahertz waves are generated on roughly the entire i type semiconductor layer 24, so it is possible to generate high intensity terahertz waves.

The n type semiconductor layer 22 is constituted from a semiconductor material containing an n type (first conductive type) impurity. The carrier density (impurity concentration) of the n type semiconductor layer 22 is preferably $1\times10^{17}/cm^3$ or greater, more preferably $1\times10^{20}/cm^3$ or greater, and even more preferably $1\times10^{20}/cm^3$ or greater and $1\times10^{25}/cm^3$ or less. The n type impurity is not particularly restricted, but examples include Si, Ge, S, Se or the like.

Also, the thickness d1 of the n type semiconductor layer 22 is not particularly restricted, and is set as appropriate according to various conditions, but is preferably 1 μm or greater and 4 mm or less, and more preferably 1 μm or greater and 10 μm or less.

Also, the p type semiconductor layer 23 is constituted by a semiconductor material containing a p type (second conductive type) impurity. The carrier density of the p type semiconductor layer 23 is preferably $1\times10^{17}/cm^3$ or greater, more preferably $1\times10^{20}/cm^3$ or greater, and even more preferably $1\times10^{20}/cm^3$ or greater and $1\times10^{25}/cm^3$ or less. This p type impurity is not particularly restricted, but examples include Zn, Mg, C or the like.

Also, the thickness d2 of the p type semiconductor layer 23 is not particularly restricted, and is set as appropriate according to various conditions, but is preferably 1 μm or greater and 2 mm or less, and more preferably 1 μm or greater and 10 μm or less.

Also, the i type semiconductor layer 24 is constituted with a semiconductor material. The semiconductor material constituting this i type semiconductor layer 24 is preferably an intrinsic semiconductor, but may also include a small volume of an n type impurity or a p type impurity. In other words, the i type semiconductor layer 24 can be said to have a carrier density lower than an n type semiconductor 22 when it contains an n type impurity, and can be said to have a carrier density lower than a p type semiconductor when it contains a p type impurity. It is preferable that even when the i type semiconductor layer 24 contains either the n type impurity or the p type impurity, the carrier density is lower than with the n type semiconductor layer 22 and the p type semiconductor layer 23.

In specific terms, the carrier density of the i type semiconductor layer 24 is preferably $1\times10^{18}$ cm$^3$ or less, more preferably $1\times10^{12}/cm^3$ or greater and $1\times10^{18}/cm^3$ or less, and even more preferably $1\times10^{12}/cm^3$ or greater and $1\times10^{16}/cm^3$ or less.

Also, the thickness d3 of the i type semiconductor layer 24 is not particularly restricted, and is set as appropriate according to various conditions, but is preferably 1 μm or greater and 4 mm or less, and more preferably 1 μm or greater and 10 μM or less.

If the thickness d3 of the i type semiconductor layer 24 is less than the lower limit value noted above, forming of the i type semiconductor layer 24 may be difficult depending on other conditions, and if it exceeds the upper limit value noted above, the withstand voltage may be insufficient depending on other conditions, so it is not possible to form an electric field of a large field intensity inside the i type semiconductor layer 24, and because of that, it is not possible to generate high intensity terahertz waves.

The semiconductor material of the p type semiconductor layer 23, the n type semiconductor layer 33, and the i type semiconductor layer 24 is not particularly restricted, and it is possible to use various types of items, but it is preferable to use a III-V compound semiconductor. Also, the III-V compound semiconductor is not particularly restricted, and examples include GaAs, InP, InAs, InSb and the like.

The material of the insulation layer 25 is not particularly restricted as long as it is a material having insulating properties, and examples include fluorine based resin, polyimide, a borazine compound, hydrogenated siloxane, benzocyclobutene, SiN, SiO$_2$ and the like.

A power supply device 18 is electrically connected to the electrodes 28 and 29 respectively via a pad, conducting wire, connector or the like (not illustrated), and direct current voltage is applied between the electrode 28 and the electrode 29 so that the electrode 28 side is positive.

Next, the operation of the terahertz wave generating device 1 will be described.

With the terahertz wave generating device 1, first, light pulses are generated by the light pulse generator 4 of the light source device 3. The pulse width of the light pulses generated by the light pulse generator 4 is larger than the target pulse width. The light pulses generated by the light pulse generator 4 pass through the waveguide, and pass through the first pulse compressor 5, the amplifier 6, and the second pulse compressor 7 sequentially in that order.

First, at the first pulse compressor 5, pulse compression based on saturable absorption is performed on the light pulses, and the pulse width of the light pulses is decreased. Next, at the amplifier 6, the light pulses are amplified. Finally, at the second pulse compressor 7, pulse compression based on group velocity dispersion compensation is performed on the light pulses, and the pulse width of the light pulses is decreased. In this way, light pulses of the target pulse width are generated, and are emitted from the second pulse compressor 7.

The light pulses emitted from the light source device 3 are irradiated at the incidence surface 241 of the i type semiconductor layer 24 from the side of the photoconductive antenna 2, are made incident from the incidence surface 241 into the i type semiconductor layer 24, and terahertz waves are generated at the i type semiconductor layer 24. These terahertz waves are lead by the i type semiconductor layer 24, and advance within that i type semiconductor layer 24 toward the emission surface 242 side. Also, of the terahertz waves that advance inside the i type semiconductor layer 24, the terahertz waves that pass through the p type semiconductor layer 23 are reflected by the electrode 29, and are prevented from leaking from the top surface of the p type semiconductor layer 23, and this makes it possible for the terahertz waves to be led efficiently. Then, terahertz waves having directionality in the lengthwise direction of the i type semiconductor layer 24 are emitted from the emission surface 242.

As described above, with this terahertz wave generating device 1, the light pulses are made incident on the i type semiconductor layer 24 directly without going via the n type semiconductor layer 22 or the p type semiconductor 23, so it is possible to prevent the light pulses from being partially absorbed by the n type semiconductor layer 22 or the p type semiconductor layer 23, making it possible to generate terahertz waves efficiently.

Also, the terahertz waves generated by the i type semiconductor layer 24 are led in a designated direction by that i type semiconductor layer 24, and with this configuration, it is possible to generate terahertz waves having directionality.

Also, the light source device 3 has the first pulse compressor 5, the amplifier 6, and the second pulse compressor 7, so it is possible to make the light source device 3 more compact, and thus the terahertz wave generating device 1 more compact, and it is also possible to generate light pulses with a desired wave height and desired width, and with this configuration, it is possible to reliably generate the desired terahertz waves.

The shape of the i type semiconductor layer 24 of the photoconductive antenna 2 is not restricted to the item described above, and other examples include the items such as those shown in FIG. 6A to FIG. 6E.

Figure 6A:
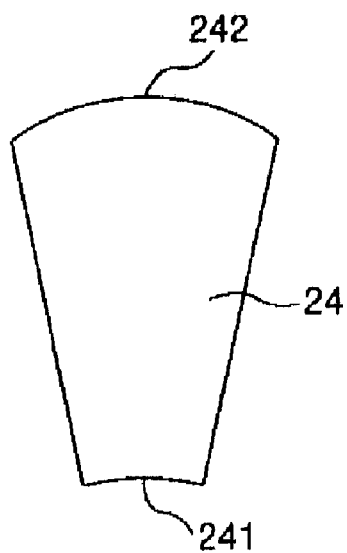
FIGS. 6A to 6E are plan views showing another constitutional example of the i type semiconductor layer of the photoconductive antenna of the terahertz wave generating device shown in FIG. 1.
Figure 6B:
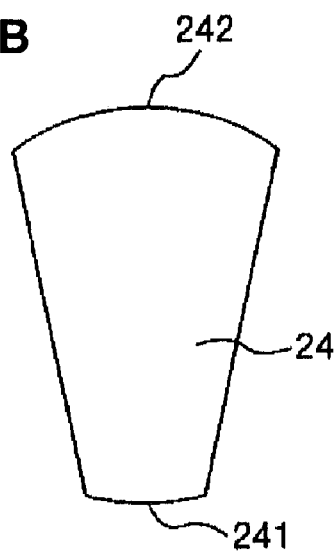

With the i type semiconductor layer 24 shown in FIG. 6A, the incidence surface 241 of the i type semiconductor layer 24 is a curved concave surface (curved surface), and the emission surface 242 is a curved convex surface (curved surface). With the planar view, the i type semiconductor layer 24 incidence surface 241 shape and the emission surface 242 shape are respectively arc shapes (curved line shapes). The curvature radius of the incidence surface 241 and the curvature radius of the emission surface 242 may be the same, or may be different.

With the i type semiconductor layer 24 shown in FIG. 613, the i type semiconductor layer 24 incidence surface 241 and emission surface 242 are respectively curved convex surfaces (curved surfaces). With the planar view, the i type semiconductor layer 24 incidence surface 241 shape and the emission surface 242 shape are respectively arc shapes (curved line shapes). The curvature radius of the incidence surface 241 and the curvature radius of the emission surface 242 may be the same, or may be different.

Figure 6C:
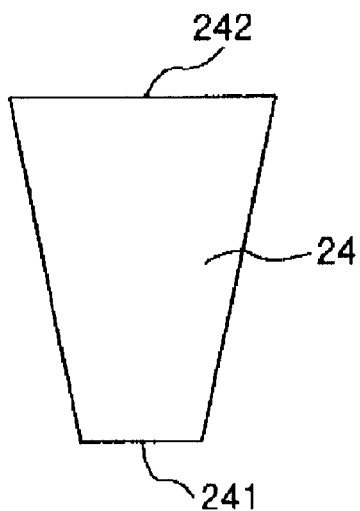

With the i type semiconductor layer 24 shown in FIG. 6C, the i type semiconductor layer 24 incidence surface 241 and emission surface 242 are respectively flat planes. With the planar view, the i type semiconductor layer 24 incidence surface 241 shape and the emission surface 242 shape are straight lines. Specifically, with the planar view, the i type semiconductor layer 24 can also be called a trapezoid.

Figure 6D:
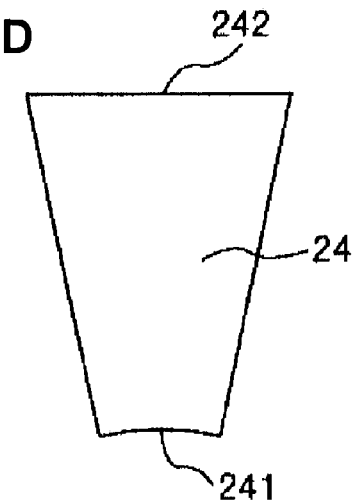

With the i type semiconductor layer 24 shown in FIG. 6D, the i type semiconductor layer 24 incidence surface 241 is a curved concave surface (curved surface), and the emission surface 242 is a flat plane. With the planar view, the i type semiconductor layer 24 incidence surface 241 shape is an arc shape (curved line shape), and the emission surface 242 shape is a straight line shape.

Figure 6E:
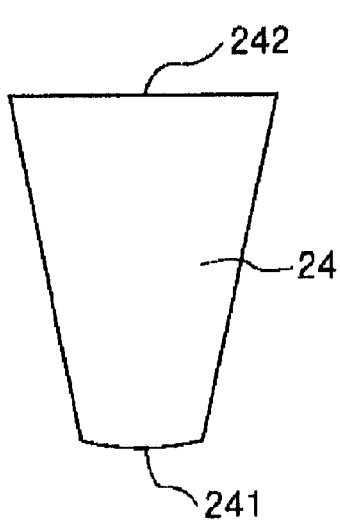

With the i type semiconductor layer 24 shown in FIG. 6E, the i type semiconductor layer 24 incidence surface 241 is a curved convex surface (curved surface), and the emission surface 242 is a flat plane. With the planar view, the i type semiconductor layer 24 incidence surface 241 shape is an arc shape (curved line shape), and the emission surface 242 shape is a straight line shape.

Second Embodiment

Figure 7:
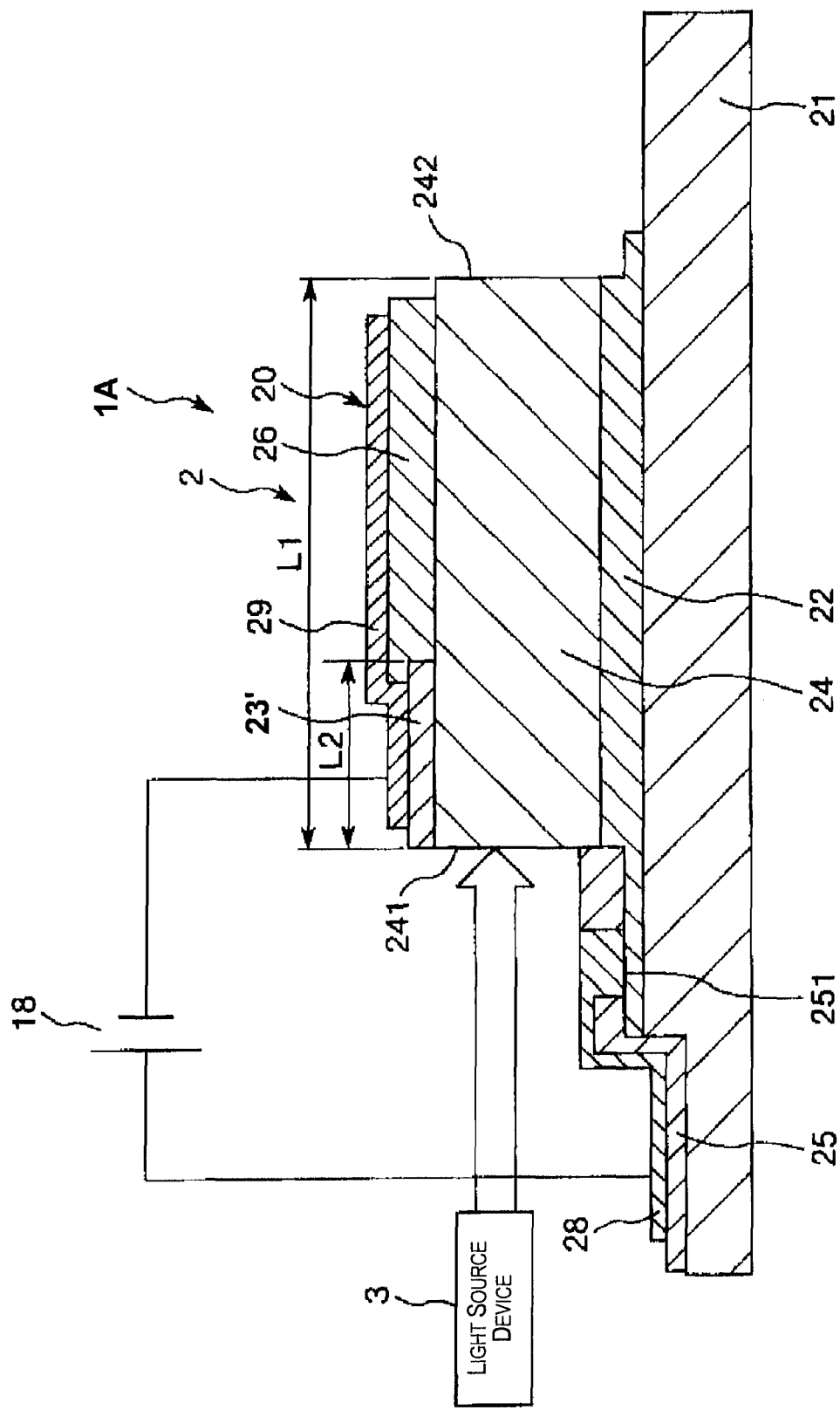
FIG. 7 is a drawing showing a second embodiment of the terahertz wave generating device of the present invention.

Referring now to FIG. 7, a terahertz wave generating device 1A in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

FIG. 7 is a drawing showing the terahertz wave generating device 1A according to the second embodiment of the present invention. With this FIG. 7, a cross section diagram is shown for the photoconductive antenna, and a block diagram is shown for the light source device. Hereafter, in FIG. 7, the upper side will be described as "upper" and the lower side will be described as "lower."

As shown in FIG. 7, with the terahertz wave generating device 1A of the second embodiment, a p type semiconductor layer 23' of the photoconductive antenna 2 is provided only on a portion of the incidence surface 241 side on the i type semiconductor layer 24. With the configuration in the drawing, the incidence surface 241 of the i type semiconductor layer 24 is flush with the end surface of the incidence surface side of the p type semiconductor layer 23' (the side surface, specifically, the surface having a normal line perpendicular to the lamination direction), and the length of the p type semiconductor layer 23' (length in the same direction as L1) L2 is set to be shorter than the length L1 of the lengthwise direction of the i type semiconductor layer 24.

With this configuration, terahertz waves are generated only on a portion of the incidence surface 241 side of the i type semiconductor layer 24, so it is possible to suppress interference between terahertz waves generated in the plurality of regions within the i type semiconductor layer 24.

Also, the dimensions of the p type semiconductor layer 23' are not particularly restricted as long as they are smaller than those of the i type semiconductor layer 24, and are set as appropriate according to various conditions, but the length L2 of the p type semiconductor layer 23' is preferably 1 μm or greater and 2 mm or less, and more preferably 3 μm or greater and 30 μm or less. Also, L2/L1 is preferably 0.00033 or greater and 0.667 or less, and more preferably 0.001 or greater and 0.1 or less.

Also, between the site at which the p type semiconductor layer 23' is not provided on the i type semiconductor layer 24 and the electrode 29, specifically, at further to the emission surface 242 side than the p type semiconductor layer 23' on the i type semiconductor layer 24, an insulation layer 26 is provided continuously with the p type semiconductor layer 23'. The material of this insulation layer 26 is not particularly restricted as long as it is a material having insulating properties, and for example it is possible to use the same material as the previously described insulation layer 25.

With this terahertz wave generating device 1A, the same effects are obtained as with the previously described first embodiment.

Third Embodiment

Figure 8:
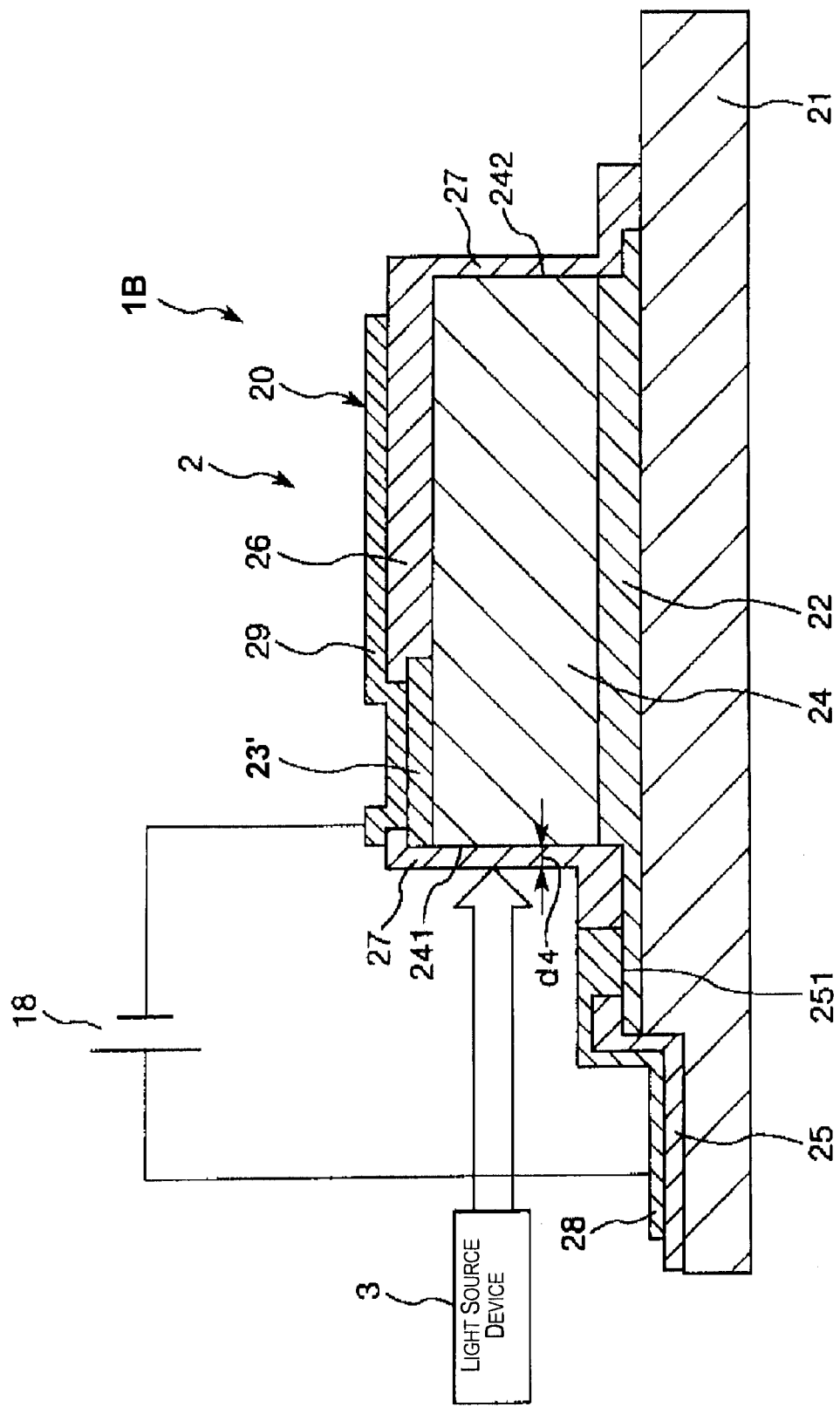
FIG. 8 is a drawing showing a third embodiment of the terahertz wave generating device of the present invention.

Referring now to FIG. 8, a terahertz wave generating device 1B in accordance with a third embodiment will now be explained. In view of the similarity between the first, second and third embodiments, the parts of the third embodiment that are identical to the parts of the first or second embodiment will be given the same reference numerals as the parts of the first or second embodiment. Moreover, the descriptions of the parts of the third embodiment that are identical to the parts of the first or second embodiment may be omitted for the sake of brevity.

FIG. 8 is a drawing showing the terahertz wave generating device 1B according to the third embodiment of the present invention. With this FIG. 8, a cross section diagram is shown for the photoconductive antenna, and a block diagram is shown for the light source device. Hereafter, in FIG. 8, the upper side will be described as "upper" and the lower side will be described as "lower."

As shown in FIG. 8, with the terahertz wave generating device 1B of the third embodiment, the photoconductive antenna 2 has a covering layer 27. This covering layer 27 covers the part of the i type semiconductor layer 24 at the side surface of the laminated body, specifically, the surface of the i type semiconductor layer 24 having a normal line perpendicular to the lamination direction. The covering layer 27 covers the entire surface that is exposed between the i type semiconductor layer 24 n type semiconductor layer 22 and the p type semiconductor layer 23'. With this configuration, the i type semiconductor layer 24 is sealed, making it possible to prevent corrosion or the like of the i type semiconductor layer 24.

The thickness d4 of the covering layer 27 is not particularly restricted, and is set as appropriate according to various conditions, but it is preferably 10 nm or greater and 1 mm or less, more preferably 1 μm or greater and 100 μm or less, and in particular, the thickness d4 of the covering layer 27 provided on the incidence surface 241 of the i type semiconductor layer 24 is preferably 1 nm or greater and 100 μm or less, and more preferably 10 nm or greater and 1 μm or less.

With this configuration, while suppressing absorption of the light pulses made incident on the incidence surface 241 by the covering layer 27, it is possible to reliably seal the i type semiconductor layer 24.

The material of the covering layer 27 is not particularly restricted as long as it is a material that can seal the i type semiconductor layer 24, but it is preferable that the relative dielectric constant (dielectric constant) of the material of the covering layer 27 is lower than the relative dielectric constant of the semiconductor material constituting the i type semiconductor layer 24. The terahertz waves have the physical property of trying to advance in a material with a higher dielectric constant, so with this configuration, it is possible for the terahertz waves to be led efficiently by the i type semiconductor layer 24.

Also, it is preferable that the relative dielectric constant of the material of the covering layer 27 is 20 or less, and more preferably 2 or greater and 10 or less.

As this kind of covering layer 27 material (low dielectric constant material), examples include polyimide (relative dielectric constant: 3), a borazine compound (relative dielectric constant: 2.3), SiN (relative dielectric constant: 7), $SiO_2$ (relative dielectric constant: 4), hydrogenated siloxane (relative dielectric constant: 3), benzocyclobutene (relative dielectric constant: 2.7), fluorine based resin (relative dielectric constant: 2.7) and the like.

With this terahertz wave generating device 1B, the same effects as with the previously described second embodiment are obtained.

The structures of the covering layer 27 in the third embodiment can also be applied to the first embodiment.

Fourth Embodiment

Figure 9:
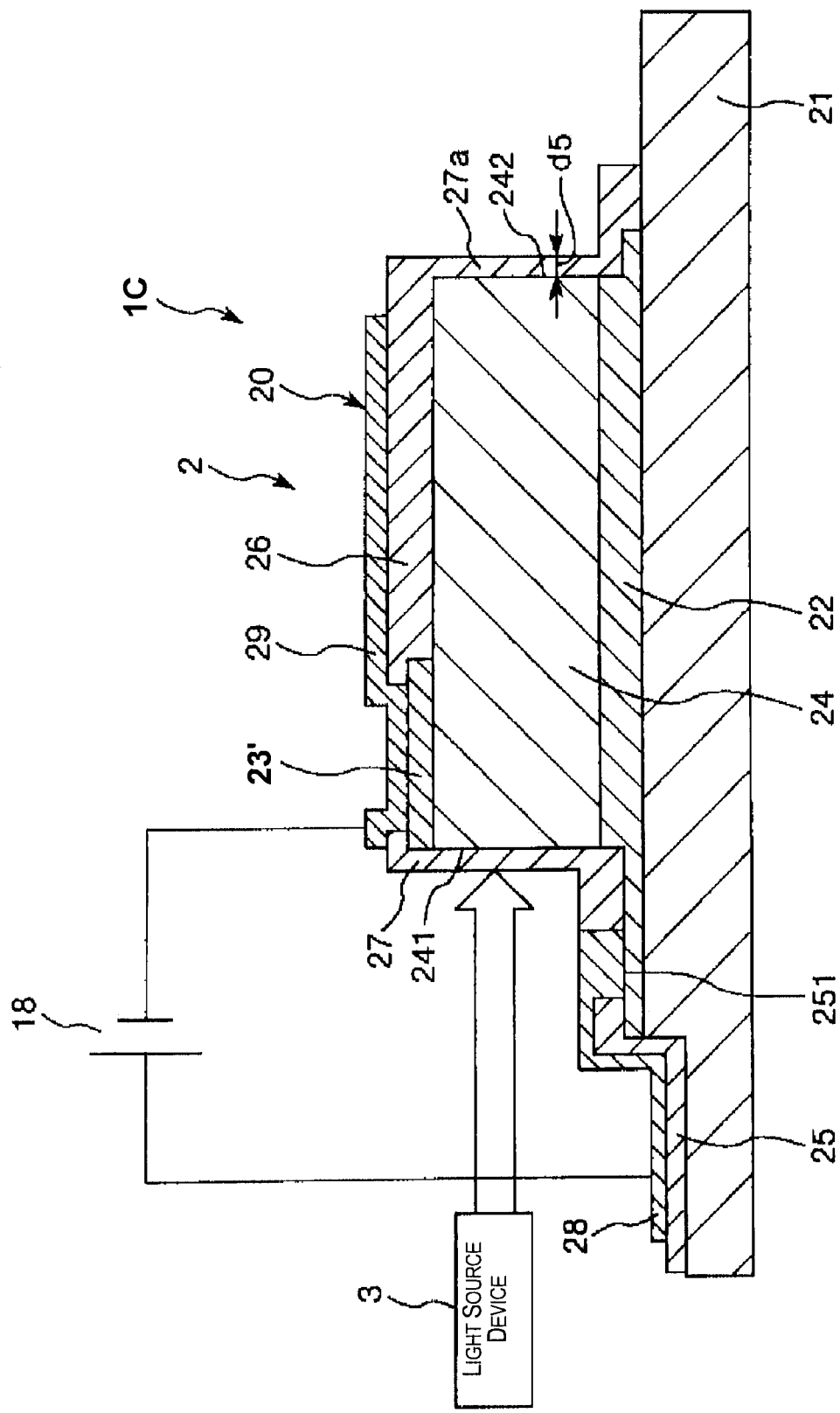
FIG. 9 is a drawing showing a fourth embodiment of the terahertz wave generating device of the present invention.

Referring now to FIG. 9, a terahertz wave generating device 1C in accordance with a fourth embodiment will now be explained. In view of the similarity between the first, second, third and fourth embodiments, the parts of the fourth embodiment that are identical to the parts of the first, second or third embodiment will be given the same reference numerals as the parts of the first, second or third embodiment. Moreover, the descriptions of the parts of the fourth embodiment that are identical to the parts of the first, second or third embodiment may be omitted for the sake of brevity.

FIG. 9 is a drawing showing the terahertz wave generating device 1C according to the fourth embodiment of the present invention. With this FIG. 9, a cross section diagram is shown for the photoconductive antenna, and a block diagram is shown for the light source device. Hereafter, in FIG. 9, the upper side will be described as "upper" and the lower side will be described as "lower."

As shown in FIG. 9, with the terahertz wave generating device 1C of the fourth embodiment, the relative dielectric constant (dielectric constant) of a material of a covering layer 27a provided on the emission surface 242 of the i type semiconductor layer 24 is higher than the relative dielectric constant of the semiconductor material constituting the i type semiconductor layer 24.

With this configuration, the terahertz waves have a physical property of trying to advance in the substance with the higher dielectric constant, so it is possible to reliably emit terahertz waves generated by the i type semiconductor layer 24 from the emission surface 242 of that i type semiconductor layer 24, making it possible to generate high intensity terahertz waves.

The thickness d5 of the covering layer 27a is not particularly restricted, and is set as appropriate according to various conditions, but it is preferably 10 nm or greater and 1 mm or less, and more preferably 1 μm or greater and 100 μm or less.

With this configuration, it is possible to more reliably emit the terahertz waves generated by the i type semiconductor layer 24 from the emission surface 242.

Also, the material of the covering layer 27a is not particularly restricted as long as its relative dielectric constant is higher than the relative dielectric constant of the semiconductor material constituting the i type semiconductor layer 24, specifically, is a dielectric material, but the relative dielectric constant of the dielectric material constituting the covering layer 27a is preferably 20 or greater, and more preferably 30 or greater and 200 or less.

As this kind of dielectric material (high dielectric constant material), examples include nitrogen-added hafnium aluminate (relative dielectric constant: 20), hafnium oxide (relative dielectric constant: 23), yttrium oxide (relative dielectric constant: 25), lanthanum oxide (relative dielectric constant: 27), niobium pentoxide (relative dielectric constant: 41), titanium dioxide (rutile) (relative dielectric constant: 80), and titanium oxide (relative dielectric constant: 160) and the like.

The covering layer 27 other than the covering layer 27a is the same as that of the previously described third embodiment, so a description of that is omitted.

With this terahertz wave generating device 1C, the same effects as with the previously described third embodiment can be obtained.

The structure of the covering layer 27a in the fourth embodiment can also be applied to the first or second embodiment.

Fifth Embodiment

Figure 10:
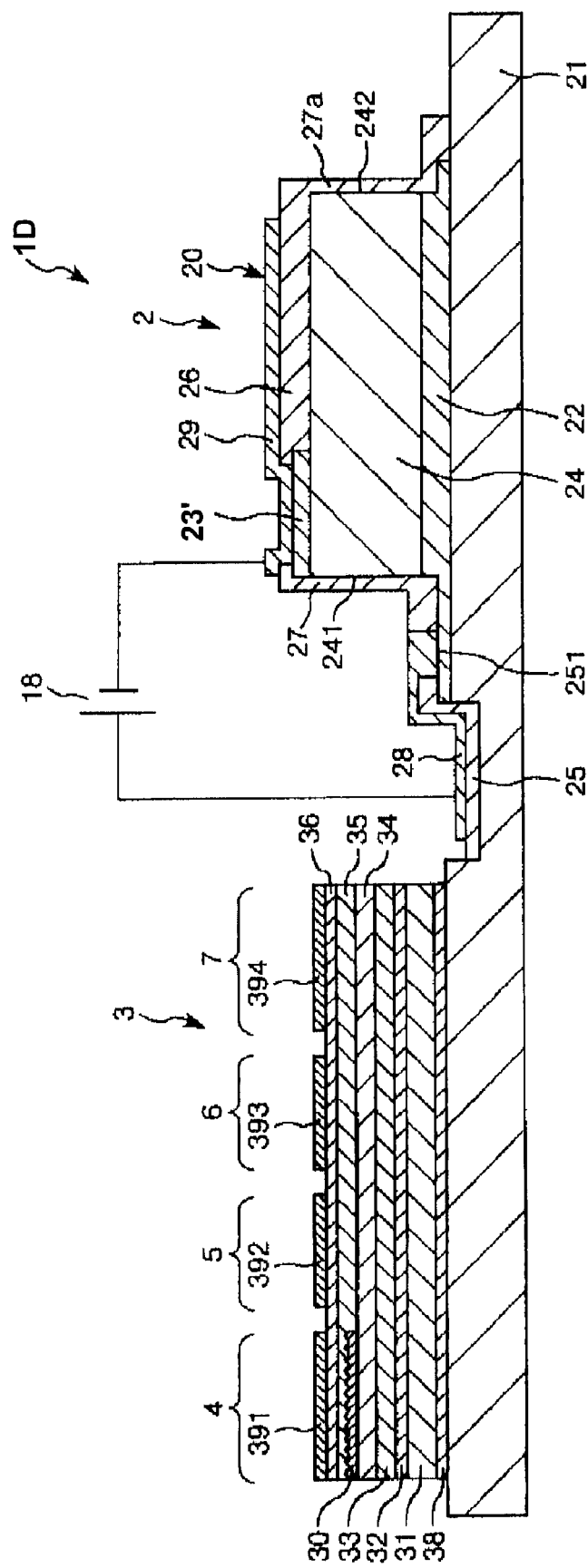
FIG. 10 is a cross section view showing a fifth embodiment of the terahertz wave generating device of the present invention.

Referring now to FIG. 10, a terahertz wave generating device 1D in accordance with a fifth embodiment will now be explained. In view of the similarity between the first, second, third, fourth and fifth embodiments, the parts of the fifth embodiment that are identical to the parts of the first, second, third or fourth embodiment will be given the same reference numerals as the parts of the first, second, third or fourth embodiment. Moreover, the descriptions of the parts of the fifth embodiment that are identical to the parts of the first, second or third embodiment may be omitted for the sake of brevity.

FIG. 10 is a cross section diagram showing the terahertz wave generating device 1D according to the fifth embodiment of the present invention. Hereafter, in FIG. 10, the upper side will be described as "upper" and the lower side will be described as "lower."

As shown in FIG. 10, with the terahertz wave generating device 1D of the fifth embodiment, the light source device 3 and the photoconductive antenna 2 are respectively provided on the substrate 21. This light source device 3 and the photoconductive antenna 2 are respectively formed on the substrate 21 and formed as an integral unit with the substrate 21. Specifically, the light source device 3 and the photoconductive antenna 2 are given a monolithic structure.

Also, with this terahertz wave generating device 1D, the alignment of the light source device 3 and the photoconductive antenna 2 can be performed at the same time as when the light source device 3 and the photoconductive antenna 2 are formed on the substrate 21, so it is possible to perform higher precision alignment within the process range of error. Because of that, compared to when the light source device 3 and the photoconductive antenna 2 are manufactured separately, and they are installed on a base while aligning them, it is possible to more easily manufacture the terahertz wave generating device 1.

Also, the light source device 3 and the photoconductive antenna 2 are given a monolithic structure, so it is possible to make the terahertz wave generating device more compact.

Also, with this terahertz wave generating device 1D, the same effects as with the previously described fourth embodiment can be obtained.

In the description of the fifth embodiment, the structure of the photoconductive antenna in the terahertz wave generation device 1D is basically the same as the structure of the photoconductive antenna in the terahertz wave generation device 1C in the fourth embodiment. It will be apparent to those skilled in the art from this disclosure that the structure of the photoconductive antenna in the terahertz wave generation device 1, 1A or 1B in the first, second or third embodiment can also be applied to the terahertz wave generation device 1D of the fifth embodiment.

Embodiment of Imaging Device

Figure 11:
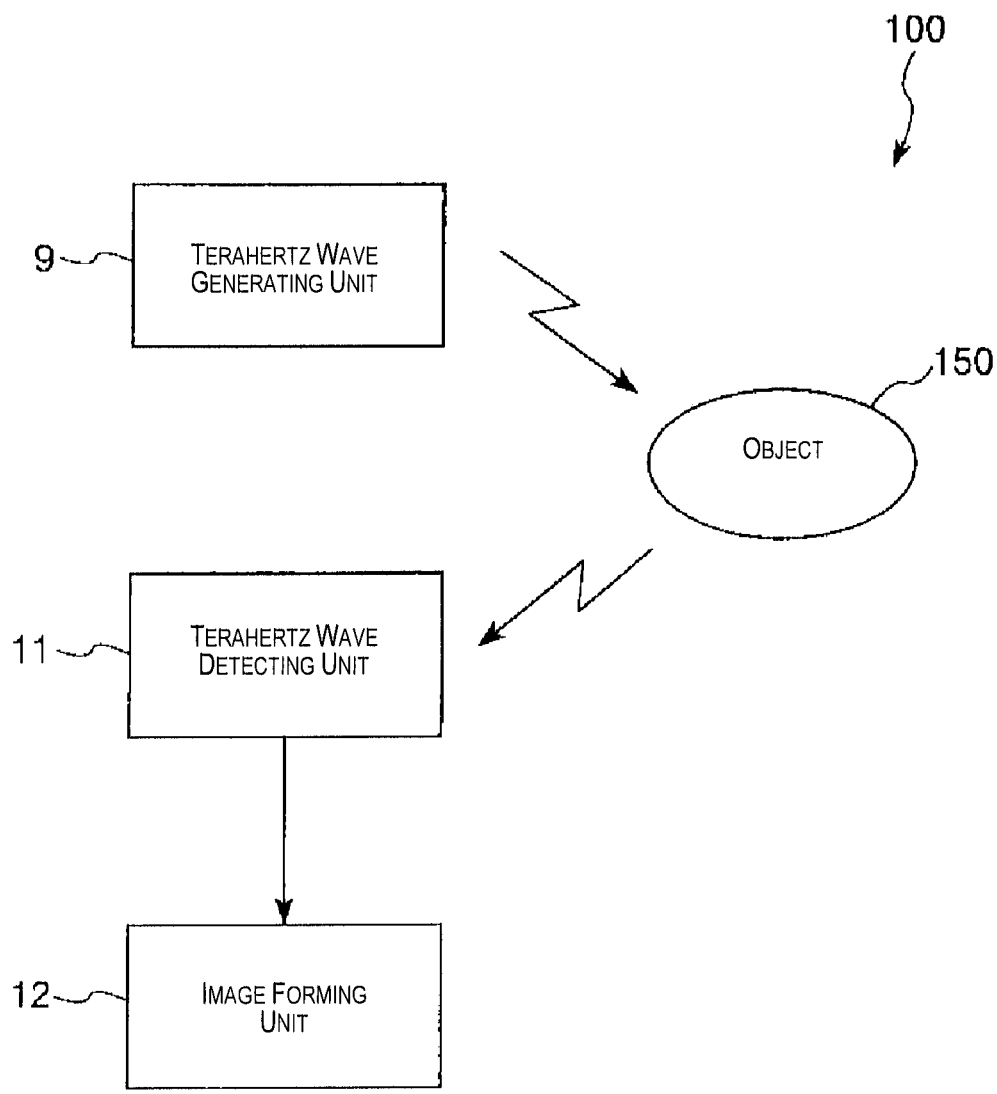
FIG. 11 is a block diagram showing an embodiment of the imaging device of the present invention.
Figure 12:
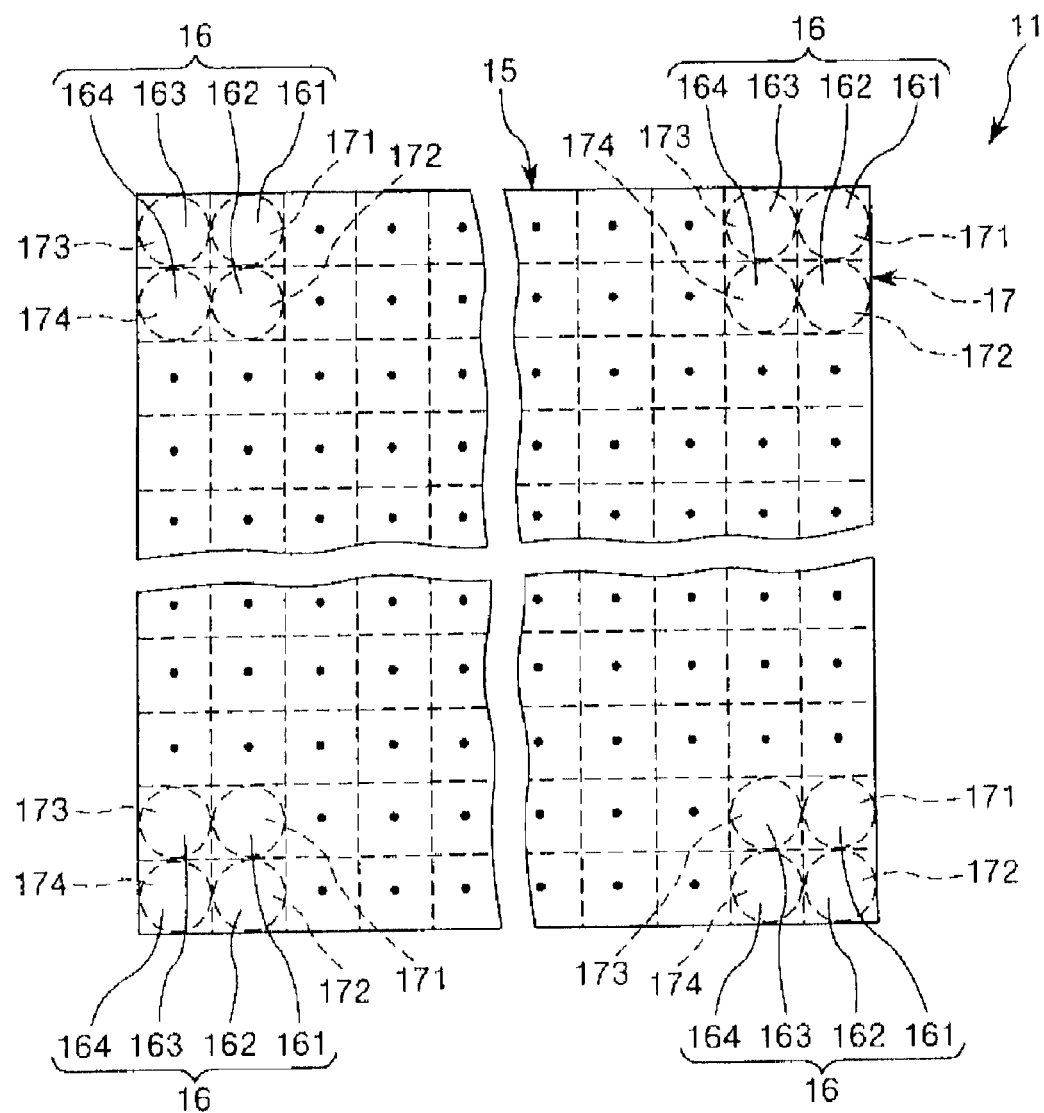
FIG. 12 is a plan view showing the terahertz wave detecting unit of the imaging device shown in FIG. 11.
Figure 13:
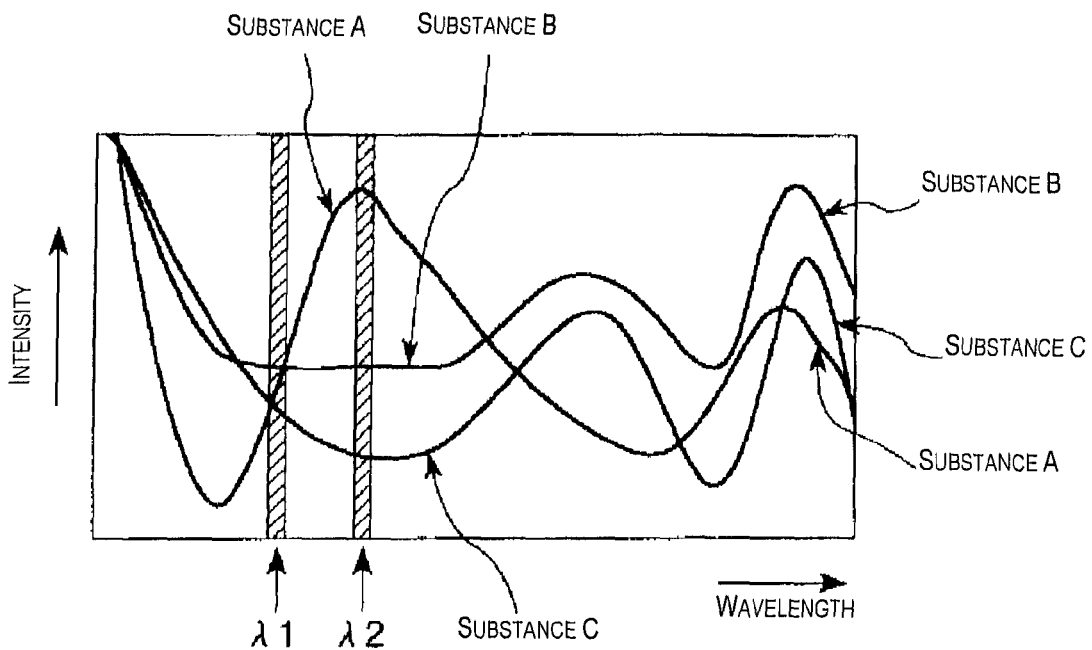
FIG. 13 is a graph showing the spectrum in the terahertz band of the object.
Figure 14:
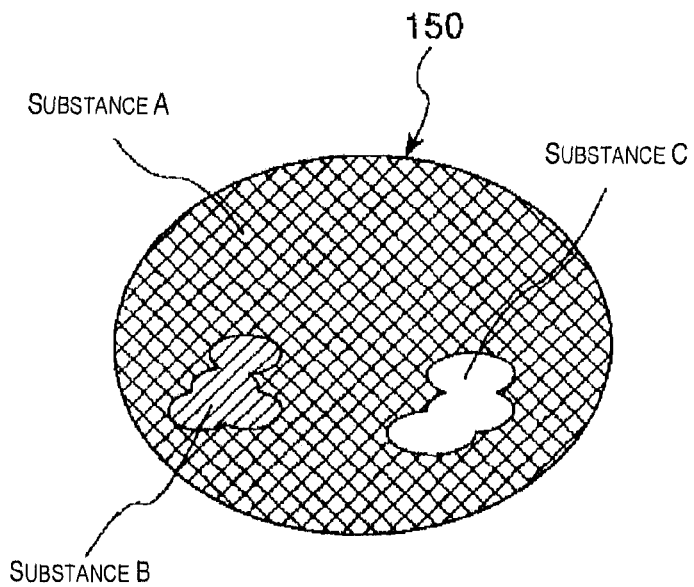
FIG. 14 is a drawing of the image showing the distribution of substances A, B, and C of the object.

FIG. 11 is a block diagram showing an embodiment of the imaging device of the present invention. FIG. 12 is a plan view showing the terahertz wave detecting unit of the imaging device shown in FIG. 11. FIG. 13 is a graph showing the spectrum of the terahertz band of the object. FIG. 14 is a drawing of an image showing the distribution of the substances A, B, and C of the object.

As shown in FIG. 11, the imaging device 100 is equipped with a terahertz wave generating unit 9, a terahertz wave detecting unit 11 for detecting terahertz waves emitted from the terahertz wave generating unit 9 and passed through or reflected by the object 150, and an image forming unit 12 that generates an image of the object 150, specifically, image data, based on the detection results of the terahertz wave detecting unit 11. The configuration of the terahertz wave generating unit 9 is the same as the previously noted terahertz wave generating device 1, so a description will be omitted here. In other words, any of the terahertz wave generating devices 1, 1A, 1B, 1C and 1D described in the first through fifth embodiment can be used as the terahertz wave generating unit 9.

Also, as the terahertz wave detecting unit 11, an item is used that is equipped with a filter 15 that transmits terahertz waves of target wavelengths, and a detection unit 17 that detects the terahertz waves of the target wavelengths transmitted by the filter 15. Also, as the detection unit 17, for example, an item is used that converts terahertz waves to heat and detects it, specifically, an item that converts terahertz waves to heat, and detects the energy (intensity) of the terahertz waves. As this kind of detection unit, examples include pyroelectric sensors, bolometers and the like. Naturally, the terahertz wave detecting unit 11 is not restricted to an item of this constitution.

Also, the filter 15 has a plurality of pixels (unit filter units) 16 arranged two dimensionally. Specifically, the pixels 16 are arranged in matrix form.

Also, the pixels 16 have a plurality of fields that transmit terahertz waves of mutually different wavelengths, specifically, a plurality of fields that have mutually different transmitted terahertz wavelengths (hereafter also called "transmission wavelengths"). With the constitution in the drawing, each pixel 16 has a first field 161, a second field 162, a third field 163, and a fourth field 164.

Also, the detection unit 17 has a first unit detecting unit 171, a second unit detecting unit 172, a third unit detecting unit 173, and a fourth unit detecting unit 174 provided respectively corresponding to the first field 161, second field 162, third field 163, and fourth field 164 of each pixel 16 of the filter 15. Each first unit detecting unit 171, second unit detecting unit 172, third unit detecting unit 173, and fourth unit detecting unit 174 respectively convert to heat and detect terahertz waves that were transmitted through the first field 161, the second field 162, the third field 163, and the fourth field 164 of each pixel 16. As a result, at each respective pixel 16, it is possible to reliably detect the terahertz waves of four target wavelengths.

Next, a use example of the imaging device 100 will be described.

First, the object 150 that is the subject of spectral imaging is constituted by three substances A, B, and C. The imaging device 100 performs spectral imaging of this object 150. Also, here, as an example, the terahertz wave detecting unit 11 detects terahertz waves reflected by the object 150.

With each pixel 16 of the filter 15 of the terahertz wave detecting unit 11, a first field 161 and a second field 162 are used.

Also, when the transmission wavelength of the first field 161 is $\lambda 1$ and the transmission wavelength of the second field 162 is $\lambda 2$, and the intensity of the wavelength $\lambda 1$ component of the terahertz wave reflected by the object 150 is $\alpha 1$ and the intensity of the transmission wavelength $\lambda 2$ component is $\alpha 2$, the transmission wavelength $\lambda 1$ of the first field 161 and the transmission wavelength $\lambda 2$ of the second field 162 are set so that the difference ($\alpha 2 - \alpha 1$) between the intensity $\alpha 2$ and intensity $\alpha 1$ can be clearly mutually distinguished for the substance A, substance B, and substance C.

As shown in FIG. 13, with substance A, the difference between the intensity $\alpha 2$ of the wavelength $\lambda 2$ component of the terahertz waves reflected by the object 150 and the intensity $\alpha 1$ of the wavelength $\lambda 1$ component ($\alpha 2 - \alpha 1$) is a positive value.

With substance B, the difference between intensity $\alpha 2$ and intensity $\alpha 1$ ($\alpha 2 - \alpha 1$) is zero.

With substance C, the difference between intensity $\alpha 2$ and intensity $\alpha 1$ ($\alpha 2 - \alpha 1$) is a negative value.

With the imaging device 100, when performing spectral imaging of the object 150, first, terahertz waves are generated by the terahertz wave generating unit 9, and those terahertz waves are irradiated on the object 150. Then, the terahertz wave detecting unit 11 detects the terahertz waves reflected by the object 150 as $\alpha 1$ and $\alpha 2$. These detection results are sent to the image forming unit 12. The detection of irradiation of terahertz waves on the object 150 and terahertz waves reflected by the object 150 is performed for the overall object 150.

The image forming unit 12 finds the difference ($\alpha 2 - \alpha 1$) between the intensity $\alpha 2$ of the wavelength $\lambda 2$ component of the terahertz waves transmitted through the second field 162 of the filter 15 and the intensity $\alpha 1$ of the wavelength $\lambda 1$ component of the terahertz waves transmitted through the first field 161 based on the detection results. Then, of the object 150, sites for which the difference is a positive value are determined and specified as being substance A, sites for which the difference is zero as substance B, and sites for which the difference is a negative value as substance C.

As shown in FIG. 14, the image forming unit 12 creates image data of an image showing the distribution of the substances A, B and C of the object 150. This image data is sent to a monitor (not illustrated) from the image forming unit 12, and an image showing the distribution of the substance A, substance B, and substance C of the object 150 is displayed on the monitor. In this case, for example, color coded display is done so that the field in which substance A of the object 150 is distributed is shown as black, the field in which substance B is distributed is shown as gray, and the field in which substance C is distributed is shown as white. With this imaging device 100, as described above, it is possible to identify each substance constituting the object 150 and to simultaneously perform distribution measurement of each substance.

The application of the imaging device 100 is not limited to the item described above, and for example, it is possible to irradiate terahertz waves on a person, to detect terahertz waves transmitted or reflected by that person, and by performing processing at the image forming unit 12, it is possible to determine whether that person is holding a gun, knife, illegal drugs or the like.

Embodiment of Measuring Device

Figure 15:
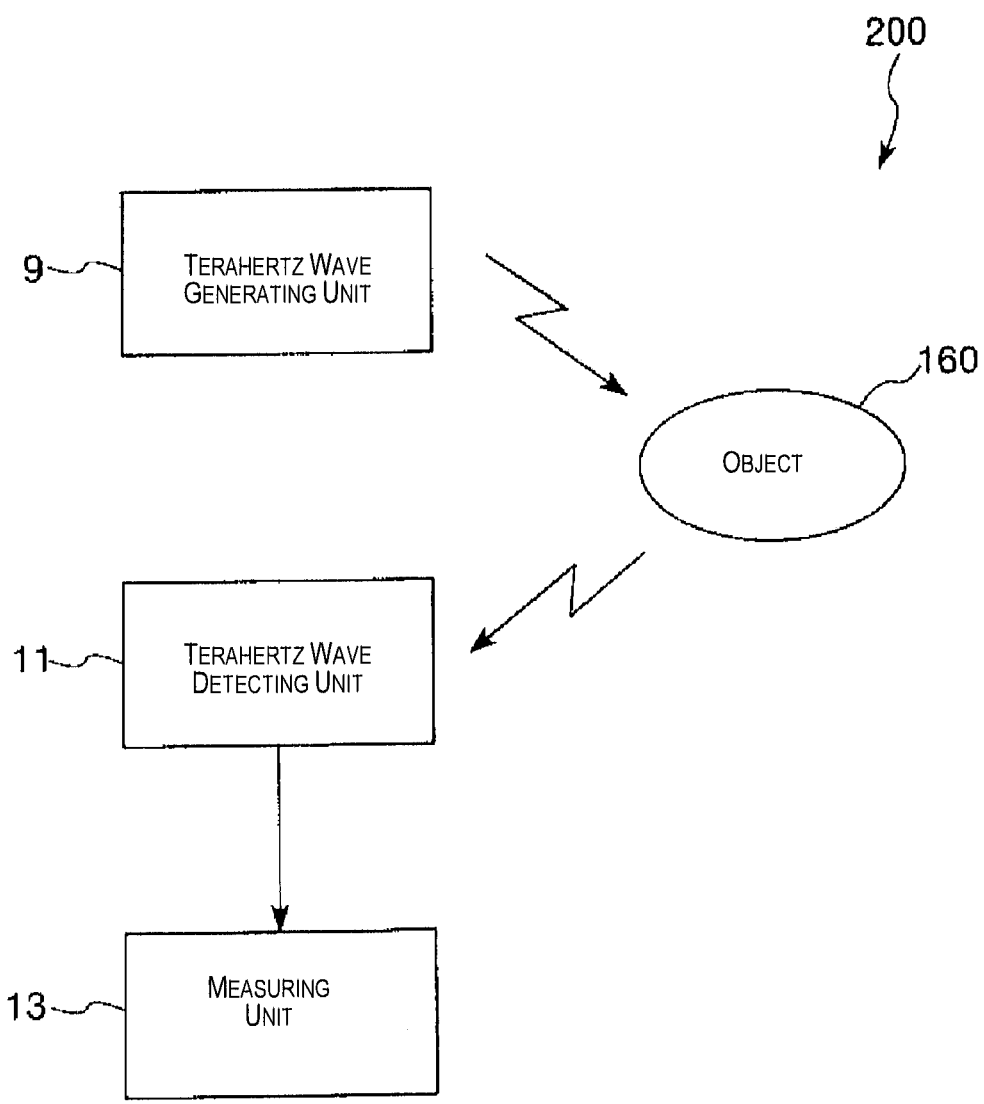
FIG. 15 is a block diagram showing an embodiment of the measuring device of the present invention.

FIG. 15 is a block diagram showing an embodiment of the measuring device of the present invention.

Following, the description of the embodiment of the measuring device will focus on the differences from the previously described embodiment of the imaging device, the same items will be given the same code numbers, and a detailed description of those will be omitted.

As shown in FIG. 15, the measuring device 200 is equipped with a terahertz wave generating unit 9 for generating terahertz waves, a terahertz wave detecting unit 11 for detecting terahertz waves emitted from the terahertz wave generating unit 9 and transmitted through or reflected by the object 160, and a measuring unit 13 for measuring the object 160 based on the detection results of the terahertz wave detecting unit 11.

Next, a use example of the measuring device 200 will be described.

With the measuring device 200, when performing spectroscopic measurement of the object 160, first, terahertz waves are generated by the terahertz wave generating unit 9, and those terahertz waves are irradiated on the object 160. Then, the terahertz waves transmitted by or reflected by the object 160 are detected by the terahertz wave detecting unit 11. These detection results are sent to the measuring unit 13. Irradiation of the terahertz waves on the object 160 and detection of the terahertz waves transmitted by or reflected by the object 160 are performed for the overall object 160.

With the measuring unit 13, from the detection results, the respective intensities of the terahertz waves that were transmitted through the first field 161, the second field 162, the third field 163, and the fourth field 164 of the filter 15 are found out, and analysis or the like of the object 160 components and their distribution is performed.

Embodiment of Camera

Figure 16:
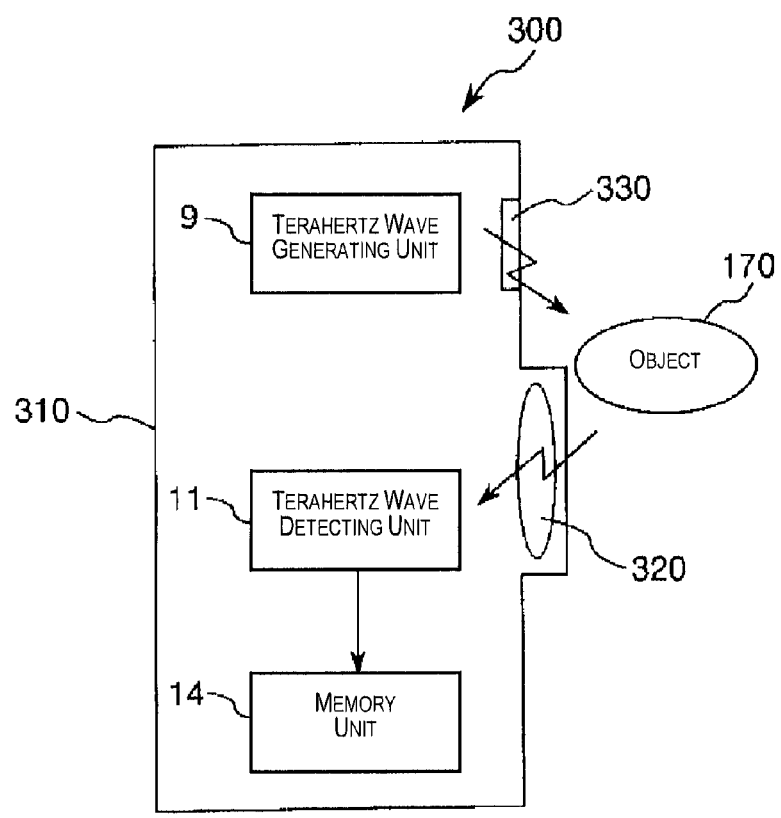
FIG. 16 is a block diagram showing an embodiment of the camera of the present invention.

FIG. 16 is a block diagram showing the embodiment of the camera of the present invention. Also, FIG. 17 shows a schematic perspective view showing an embodiment of the camera of the present invention.

Following, the description of the embodiment of the camera will focus on the differences from the previously described embodiment of the image device, the same items are given the same code numbers as in the previously described embodiments, and a detailed description of those will be omitted.

Figure 17:
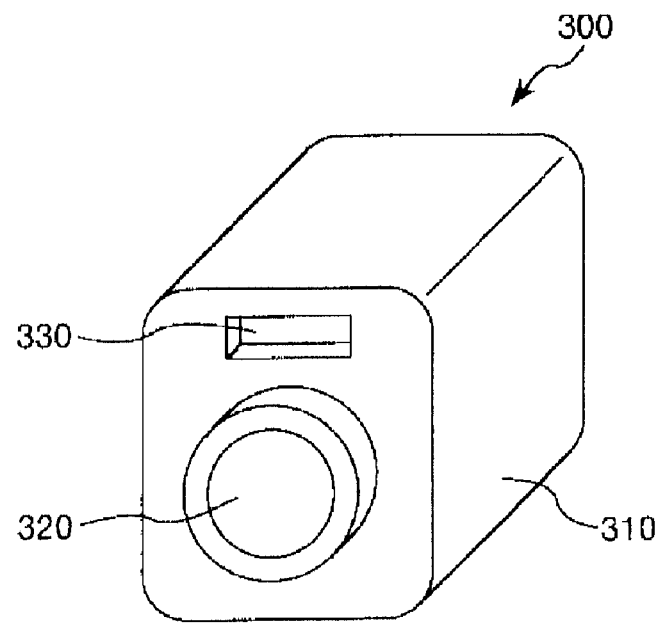
FIG. 17 is a perspective view showing an embodiment of the camera of the present invention.

As shown in FIG. 16 and FIG. 17, the camera 300 is equipped with a terahertz wave generating unit 9 for generating terahertz waves, a terahertz wave detecting unit 11 for detecting terahertz waves emitted from the terahertz wave generating unit 9 and reflected by the object 170, and a memory unit 14. Then, each of these parts is housed in a case 310 of the camera 300. Also, the camera 300 is equipped with a lens (optical system) 320 for converging (imaging) the terahertz waves reflected by the object 170 on the terahertz wave detecting unit 11, and a window part 330 for emitting to outside the case 310 the terahertz waves generated by the terahertz wave generating unit 9. The lens 320 and the window part 330 are constituted by members using silicon, quartz, polyethylene or the like that transmit or refract terahertz waves. The window part 330 can also be constituted with an aperture simply provided as a slit.

Next, a use example of the camera 300 will be described.

With the camera 300, when taking an image of the object 170, first, terahertz waves are generated by the terahertz wave generating unit 9, and those terahertz waves are irradiated on the object 170. Then, the terahertz waves reflected by the object 170 are converged (imaged) by the lens 320 to the terahertz wave detecting unit 11 and detected. The detection results are sent to and stored in the memory unit 14. Detection of irradiation of the terahertz waves on the object 170 and of the terahertz waves reflected by the object 170 is performed on the overall object 170. The detection results can also be sent to an external device such as a personal computer or the like, for example. With the personal computer, it is possible to perform various processes based on the detection results.

Above, the photoconductive antenna, the terahertz wave generating device, the camera, the imaging device, and the measuring device of the present invention were described based on the embodiments in the drawings, but the present invention is not limited to this, and the constitution of each part can be replaced with an item of any constitution having the same functions. It is also possible to add any other constituent materials to the present invention.

Also, with the present invention, it is also possible to combine the constitutions (features) of any two or more of the embodiments noted above.

Also, with the aforementioned embodiments, an n type semiconductor layer was used as the first conductive layer, and a p type semiconductor layer was used as the second conductive layer, but with the present invention, this is not restricted to these, and it is also possible to use a p type semiconductor layer for the first conductive layer and an n type semiconductor layer for the second conductive layer.

Also, with the present invention, the light pulse generator can be a separate item from the light source device.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A photoconductive antenna adapted to generate terahertz waves when irradiated by pulsed light, the photoconductive antenna comprising:
   a first conductive layer made of a semiconductor material containing a first conductive type impurity;
   a second conductive layer made of a semiconductor material containing a second conductive type impurity different from the first conductive type impurity;
   a semiconductor layer positioned between the first conductive layer and the second conductive layer, and made of a semiconductor material having a carrier density that is lower than a carrier density of the semiconductor material of the first conductive layer or a carrier density of the semiconductor material of the second conductive layer;
   a first electrode electrically connected to the first conductive layer; and
   a second electrode electrically connected to the second conductive layer,
   the semiconductor layer including an incidence surface through which the pulsed light enters the semiconductor layer, and an emission surface from which the terahertz waves are emitted, the incidence surface being positioned in a side surface of the semiconductor layer having a normal direction extending orthogonal to a lamination direction of the first conductive layer, the semiconductor layer, and the second conductive layer, and the emission surface being positioned in the side surface of the semiconductor layer at a position different from the incidence surface, and
   the semiconductor layer having an elongated shape in which a direction from the incidence surface toward the emission surface is a lengthwise direction as viewed along the lamination direction.

2. The photoconductive antenna according to claim 1, wherein
   the second conductive layer is provided only on a portion of the semiconductor layer, and a side surface of the second conductive layer having a normal direction extending orthogonal to the lamination direction is flush with the incidence surface of the semiconductor layer.

3. A terahertz wave generating device comprising:
   the photoconductive antenna according to claim 2; and
   a light source configured and arranged to generate the pulsed light.

4. A camera comprising:
   the photoconductive antenna according to claim 2;
   a light source configured and arranged to generate the pulsed light; and
   a terahertz wave detecting unit configured and arranged to detect the terahertz waves emitted from the photoconductive antenna and reflected by an object.

5. An imaging device comprising:
   the photoconductive antenna according to claim 2;
   a light source configured and arranged to generate the pulsed light;
   a terahertz wave detecting unit configured and arranged to detect the terahertz waves emitted from the photoconductive antenna and transmitted through an object or reflected by the object; and
   an image forming unit configured and arranged to generate an image of the object based on detection results of the terahertz wave detecting unit.

6. The imaging device according to claim 5, wherein
the image forming unit is configured and arranged to generate the image of the object using intensity of the terahertz waves detected by the terahertz wave detecting unit.

7. A measuring device comprising:
the photoconductive antenna according to claim 2;
a light source configured and arranged to generate the pulsed light;
a terahertz wave detecting unit configured and arranged to detect the terahertz waves emitted from the photoconductive antenna and transmitted through an object or reflected by the object; and
a measuring unit configured and arranged to measure the object based on detection results of the terahertz wave detecting unit.

8. The measuring device according to claim 7, wherein
the measuring unit is configured and arranged to measure the object using intensity of the terahertz waves detected by the terahertz wave detecting unit.

9. The photoconductive antenna according to claim 1, further comprising
a covering layer covering the side surface of the semiconductor layer.

10. The photoconductive antenna according to claim 9, wherein
a relative dielectric constant of a material of the covering layer provided on the emission surface is higher than a relative dielectric constant of the semiconductor material of the semiconductor layer.

11. A terahertz wave generating device comprising:
the photoconductive antenna according to claim 10; and
a light source configured and arranged to generate the pulsed light.

12. A camera comprising:
the photoconductive antenna according to claim 10;
a light source configured and arranged to generate the pulsed light; and
a terahertz wave detecting unit configured and arranged to detect the terahertz waves emitted from the photoconductive antenna and reflected by an object.

13. An imaging device comprising:
the photoconductive antenna according to claim 10;
a light source configured and arranged to generate the pulsed light;
a terahertz wave detecting unit configured and arranged to detect the terahertz waves emitted from the photoconductive antenna and transmitted through an object or reflected by the object; and
an image forming unit configured and arranged to generate an image of the object based on detection results of the terahertz wave detecting unit.

14. The imaging device according to claim 13, wherein
the image forming unit is configured and arranged to generate the image of the object using intensity of the terahertz waves detected by the terahertz wave detecting unit.

15. A measuring device comprising:
the photoconductive antenna according to claim 10;
a light source configured and arranged to generate the pulsed light;
a terahertz wave detecting unit configured and arranged to detect the terahertz waves emitted from the photoconductive antenna and transmitted through an object or reflected by the object; and
a measuring unit configured and arranged to measure the object based on detection results of the terahertz wave detecting unit.

16. The measuring device according to claim 15, wherein
the measuring unit is configured and arranged to measure the object using intensity of the terahertz waves detected by the terahertz wave detecting unit.

17. The photoconductive antenna according to claim 1, wherein
the semiconductor material of the semiconductor layer is a III-V compound.

18. A terahertz wave generating device comprising:
the photoconductive antenna according to claim 1; and
a light source configured and arranged to generate the pulsed light.

19. The terahertz wave generating device according to claim 18, further comprising
a substrate,
the light source and the photoconductive antenna being formed on the substrate as an integrated unit with the substrate.

20. A camera comprising:
the photoconductive antenna according to claim 1;
a light source configured and arranged to generate the pulsed light; and
a terahertz wave detecting unit configured and arranged to detect the terahertz waves emitted from the photoconductive antenna and reflected by an object.

21. An imaging device comprising:
the photoconductive antenna according to claim 1;
a light source configured and arranged to generate the pulsed light;
a terahertz wave detecting unit configured and arranged to detect the terahertz waves emitted from the photoconductive antenna and transmitted through an object or reflected by the object; and
an image forming unit configured and arranged to generate an image of the object based on detection results of the terahertz wave detecting unit.

22. The imaging device according to claim 21, wherein
the image forming unit is configured and arranged to generate the image of the object using intensity of the terahertz waves detected by the terahertz wave detecting unit.

23. A measuring device comprising:
the photoconductive antenna according to claim 1;
a light source configured and arranged to generate the pulsed light;
a terahertz wave detecting unit configured and arranged to detect the terahertz waves emitted from the photoconductive antenna and transmitted through an object or reflected by the object; and
a measuring unit configured and arranged to measure the object based on detection results of the terahertz wave detecting unit.

24. The measuring device according to claim 23, wherein
the measuring unit is configured and arranged to measure the object using intensity of the terahertz waves detected by the terahertz wave detecting unit.

25. A photoconductive antenna adapted to generate terahertz waves when irradiated by pulsed light, the photoconductive antenna comprising:
a first conductive layer made of a semiconductor material containing a first conductive type impurity;
a second conductive layer made of a semiconductor material containing a second conductive type impurity different from the first conductive type impurity;

a semiconductor layer positioned between the first conductive layer and the second conductive layer, and made of a semiconductor material having a carrier density that is lower than a carrier density of the semiconductor material of the first conductive layer or a carrier density of the semiconductor material of the second conductive layer;
a first electrode electrically connected to the first conductive layer; and
a second electrode electrically connected to the second conductive layer,
the semiconductor layer including an incidence surface through which the pulsed light enters the semiconductor layer, and an emission surface from which the terahertz waves are emitted, the incidence surface being positioned in a side surface of the semiconductor layer having a normal direction extending orthogonal to a lamination direction of the first conductive layer, the semiconductor layer, and the second conductive layer, and the emission surface being positioned in the side surface of the semiconductor layer at a position different from the incidence surface, wherein
a width of a part of the semiconductor layer as viewed along the lamination direction increases in a direction from the incidence surface toward the emission surface, the width being defined in a direction orthogonal to the direction from the incidence surface toward the emission surface.

26. A terahertz wave generating device comprising:
the photoconductive antenna according to claim 25; and
a light source configured and arranged to generate the pulsed light.

27. A camera comprising:
the photoconductive antenna according to claim 25;
a light source configured and arranged to generate the pulsed light; and
a terahertz wave detecting unit configured and arranged to detect the terahertz waves emitted from the photoconductive antenna and reflected by an object.

28. An imaging device comprising:
the photoconductive antenna according to claim 25;
a light source configured and arranged to generate the pulsed light;
a terahertz wave detecting unit configured and arranged to detect the terahertz waves emitted from the photoconductive antenna and transmitted through an object or reflected by the object; and
an image forming unit configured and arranged to generate an image of the object based on detection results of the terahertz wave detecting unit.

29. The imaging device according to claim 28, wherein
the image forming unit is configured and arranged to generate the image of the object using intensity of the terahertz waves detected by the terahertz wave detecting unit.

30. A measuring device comprising:
the photoconductive antenna according to claim 25;
a light source configured and arranged to generate the pulsed light;
a terahertz wave detecting unit configured and arranged to detect the terahertz waves emitted from the photoconductive antenna and transmitted through an object or reflected by the object; and
a measuring unit configured and arranged to measure the object based on detection results of the terahertz wave detecting unit.

31. The measuring device according to claim 30, wherein
the measuring unit is configured and arranged to measure the object using intensity of the terahertz waves detected by the terahertz wave detecting unit.

* * * * *